(12) United States Patent
Kim et al.

(10) Patent No.: US 10,361,260 B2
(45) Date of Patent: Jul. 23, 2019

(54) SEMICONDUCTOR DEVICE AND METHOD OF MANUFACTURING THE SAME

(71) Applicant: Samsung Display Co., Ltd., Yongin-Si, Gyeonggi-Do (KR)

(72) Inventors: Jaybum Kim, Seoul (KR); Kyoungseok Son, Seoul (KR); Jihun Lim, Hwaseong-si (KR); Eoksu Kim, Seoul (KR); Junhyung Lim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/684,452

(22) Filed: Aug. 23, 2017

(65) Prior Publication Data

US 2018/0083084 A1 Mar. 22, 2018

(30) Foreign Application Priority Data

Sep. 19, 2016 (KR) .................. 10-2016-0119431

(51) Int. Cl.
| | | |
|---|---|---|
| *H01L 27/32* | (2006.01) | |
| *H01L 27/12* | (2006.01) | |
| *G09G 3/3225* | (2016.01) | |
| *G09G 3/3266* | (2016.01) | |
| *G09G 3/3275* | (2016.01) | |
| *H01L 29/786* | (2006.01) | |

(52) U.S. Cl.
CPC ........ *H01L 27/3262* (2013.01); *H01L 27/124* (2013.01); *H01L 27/1225* (2013.01); *H01L 27/1248* (2013.01); *H01L 27/1251* (2013.01); *H01L 27/1255* (2013.01); *H01L 27/3248* (2013.01); *H01L 27/3258* (2013.01); *H01L 27/3265* (2013.01); *G09G 3/3225* (2013.01); *G09G 3/3266* (2013.01); *G09G 3/3275* (2013.01); *G09G 2300/0413* (2013.01); *G09G 2300/0426* (2013.01); *G09G 2330/02* (2013.01); *H01L 27/127* (2013.01); *H01L 29/7869* (2013.01); *H01L 29/78675* (2013.01); *H01L 2227/323* (2013.01)

(58) Field of Classification Search
None
See application file for complete search history.

(56) References Cited

U.S. PATENT DOCUMENTS 9,129,927 B2 9/2015 Gupta et al.
9,891,735 B2 * 2/2018 Bae .......................... G06F 3/044
(Continued)

FOREIGN PATENT DOCUMENTS

| KR | 10-0891457 | 4/2009 |
|---|---|---|
| KR | 10-2010-0086256 | 7/2010 |
| KR | 10-2011-0053721 | 5/2011 |

*Primary Examiner* — Michael Lebentritt
(74) *Attorney, Agent, or Firm* — Innovation Counsel LLP

(57) ABSTRACT

A semiconductor device includes a base substrate, a first transistor including a first semiconductor pattern, a first control electrode, a first input electrode, and a first output electrode, each of which is disposed on the base substrate, a second transistor including a second semiconductor pattern, a second control electrode, a second input electrode, and a second output electrode, and a plurality of insulating layers. A single first through part exposes the first control electrode and the first semiconductor pattern disposed on both sides of the first control electrode.

30 Claims, 20 Drawing Sheets

(56) References Cited

U.S. PATENT DOCUMENTS

| | | | |
|---|---|---|---|
| 2006/0258061 A1* | 11/2006 | Jung | H01L 27/12 438/149 |
| 2007/0159074 A1* | 7/2007 | Choi | H01L 27/1251 313/504 |
| 2015/0069383 A1* | 3/2015 | Suzuki | H01L 29/78606 257/43 |
| 2015/0102349 A1* | 4/2015 | Lee | H01L 27/1255 257/71 |
| 2016/0240801 A1* | 8/2016 | Chang | H01L 51/0097 |
| 2016/0260376 A1* | 9/2016 | Shin | G09G 3/2022 |
| 2016/0284783 A1* | 9/2016 | Kim | H01L 27/3276 |
| 2017/0263690 A1* | 9/2017 | Lee | H01L 27/3258 |
| 2018/0076238 A1* | 3/2018 | Lim | H01L 29/78609 |
| 2018/0102499 A1* | 4/2018 | Pyo | H01L 51/5228 |
| 2018/0108312 A1* | 4/2018 | Aoki | G09G 3/3225 |
| 2018/0138211 A1* | 5/2018 | Yamazaki | H01L 27/1214 |

* cited by examiner

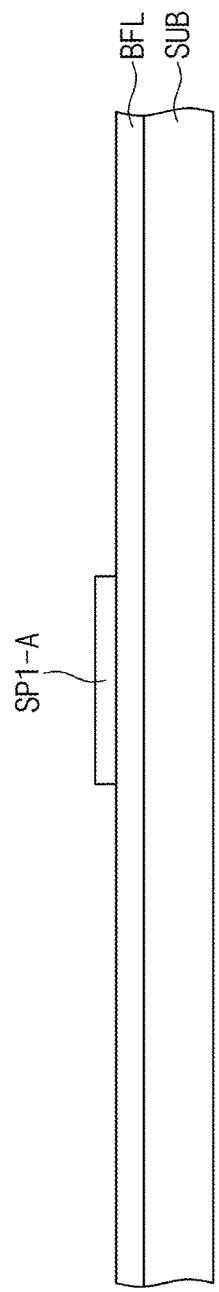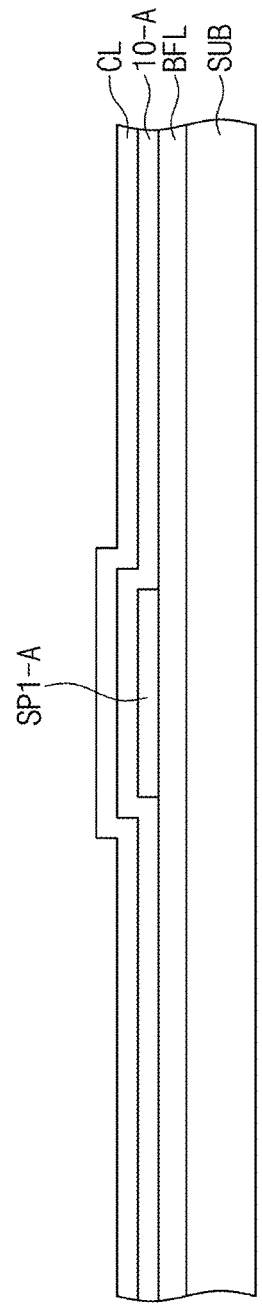

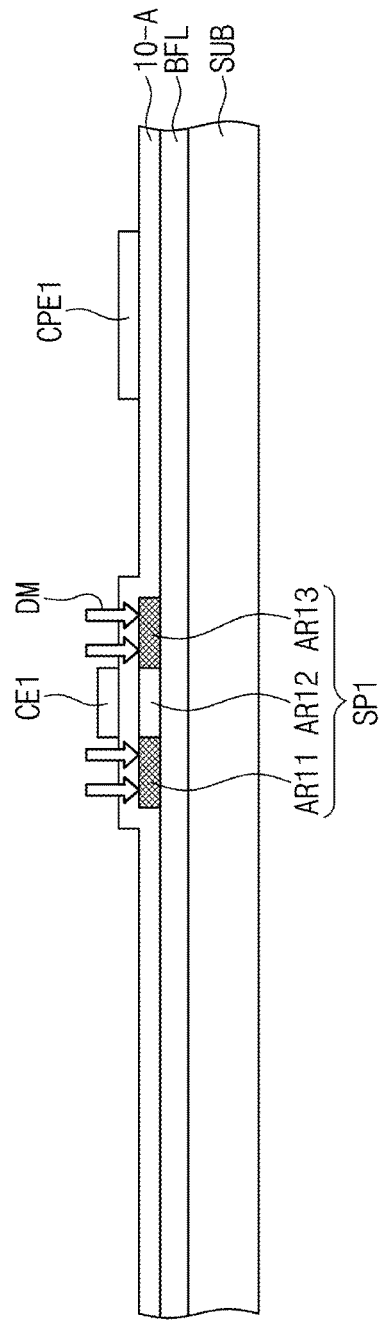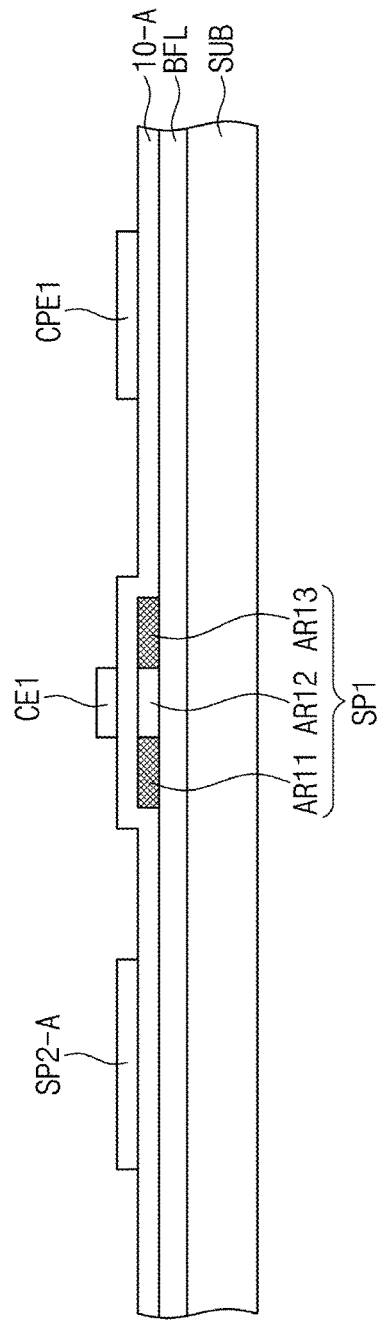

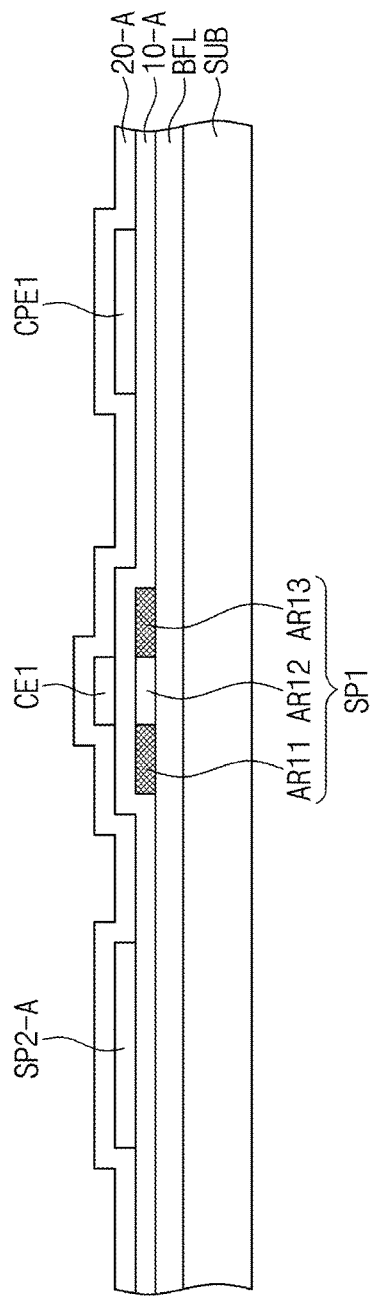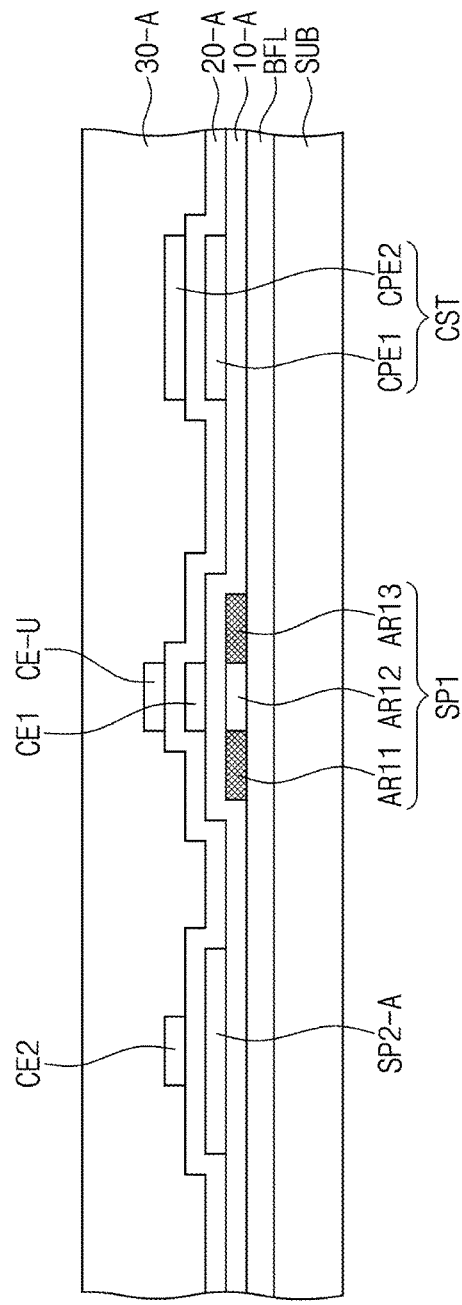

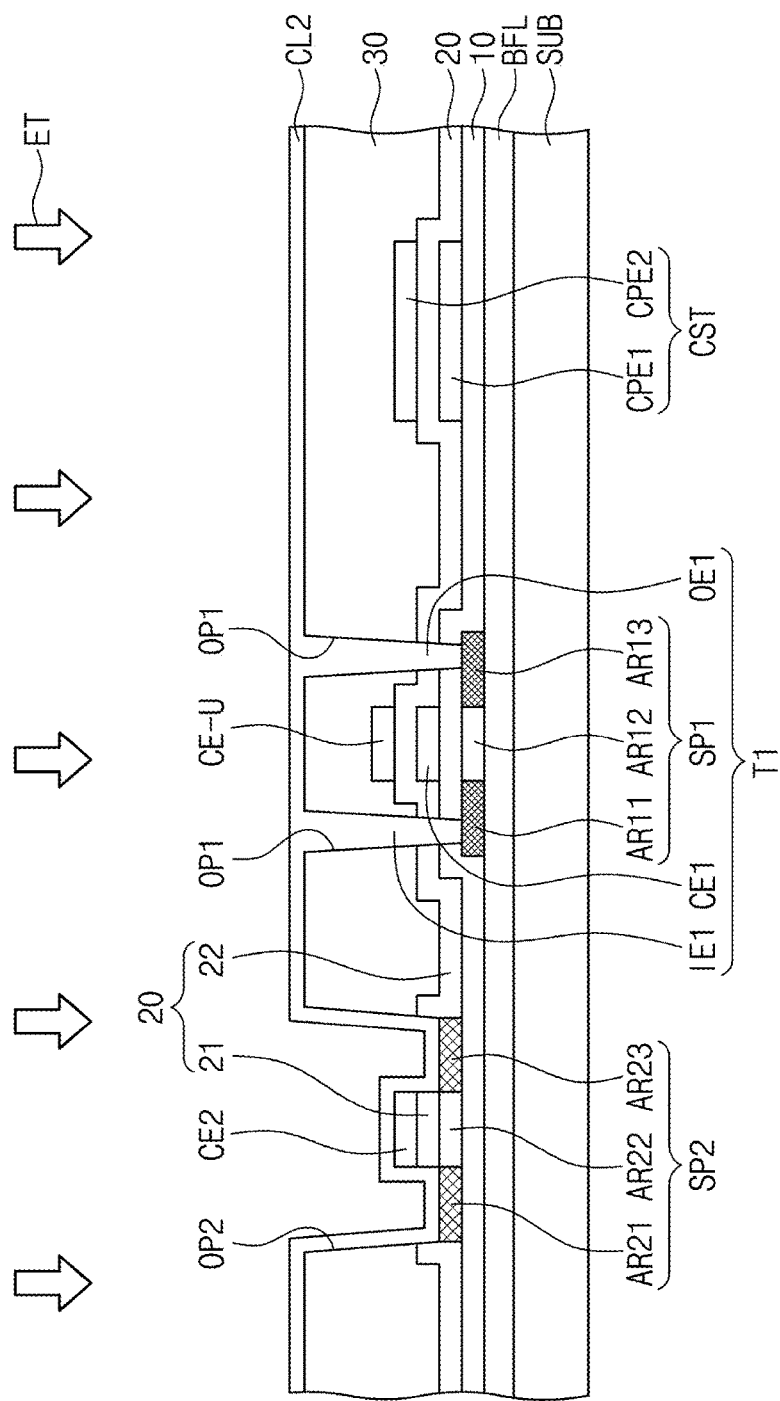

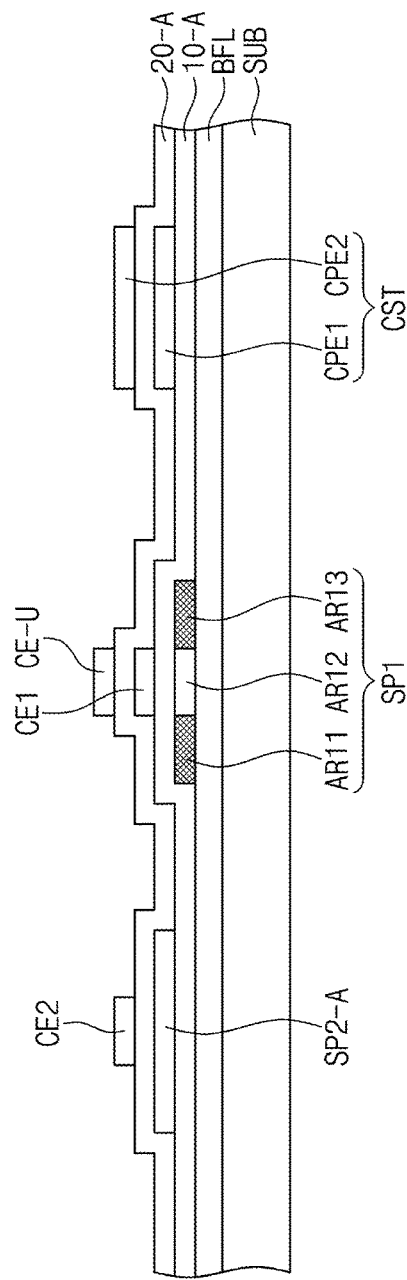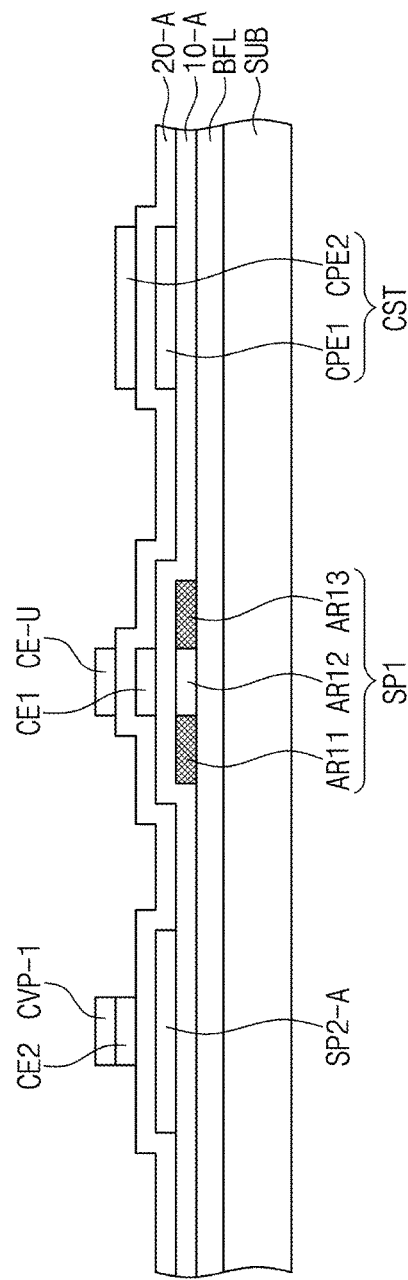

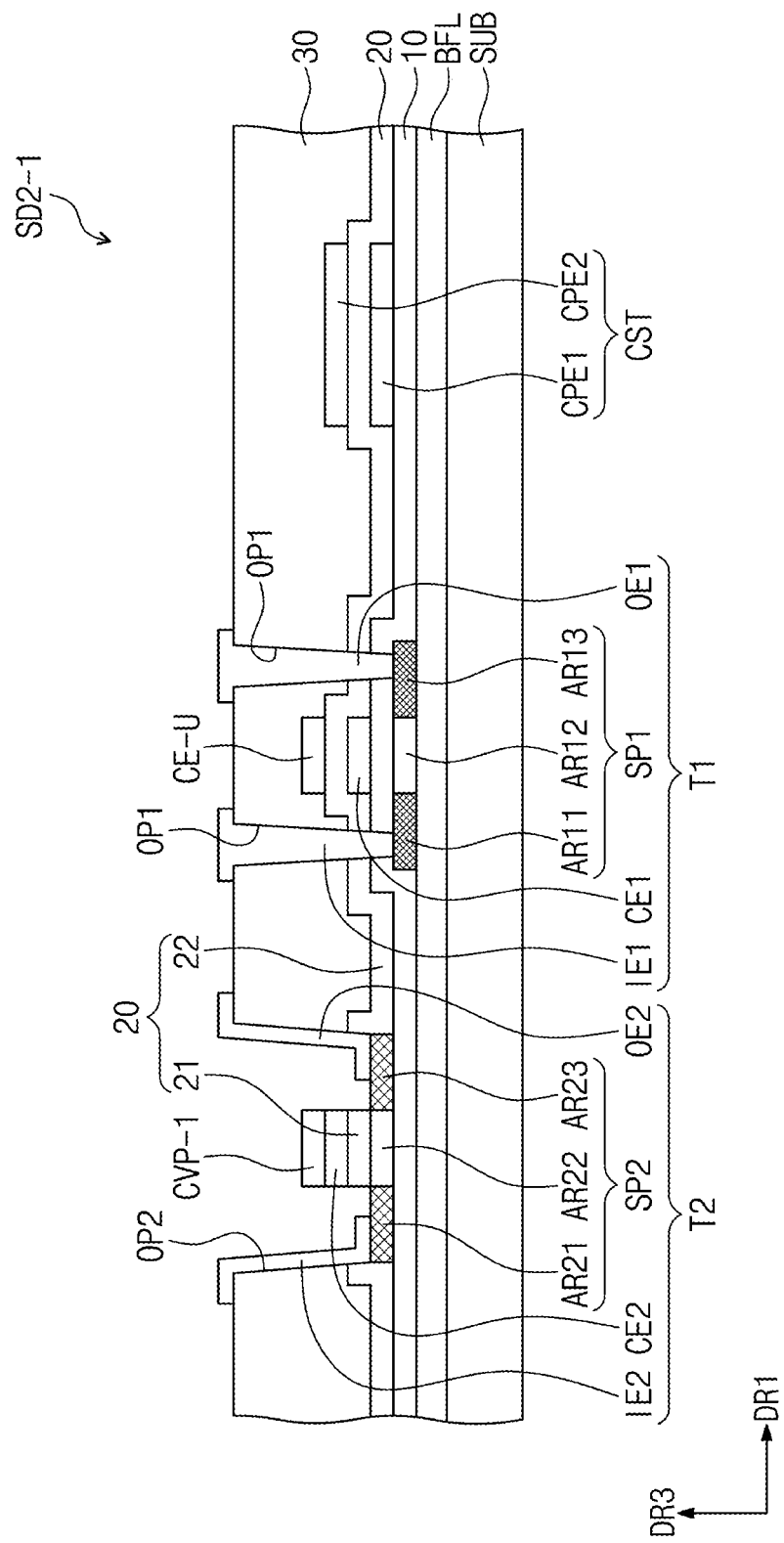

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2016-0119431, filed on Sep. 19, 2016, the entire contents of which are hereby incorporated by reference.

BACKGROUND

The present disclosure herein relates to a semiconductor device and a method of manufacturing the same, and more particularly, to a semiconductor device having improved reliability and a method of manufacturing the same.

A semiconductor device includes at least one thin film transistor. A thin film transistor includes a semiconductor pattern with a semiconductor material. A display device, that is, one embodiment of a semiconductor device, may include a plurality of pixels and a driving circuit for controlling the plurality of pixels. The driving circuit may include at least one thin film transistor. A thin film transistor that configures the driving circuit provides electrical signals for controlling pixels to a corresponding pixel.

Each pixel may include a pixel driving circuit and a display element connected to the pixel driving circuit. The pixel driving circuit may include at least one thin film transistor and capacitor. A thin film transistor and a capacitor, which are as a component of the pixel driving circuit, control the display element in response to an electrical signal provided from the driving circuit.

SUMMARY

The present disclosure provides a semiconductor device having a structure with improved reliability during a process and a method of manufacturing the same.

An embodiment of the inventive concept provides a semiconductor device including: a base substrate; a first transistor disposed on the base substrate and including a first semiconductor pattern, a first control electrode, a first input electrode, and a first output electrode; a second transistor disposed on the base substrate and including a second semiconductor pattern, a second control electrode, a second input electrode, and a second output electrode; and a plurality of insulating layers, and a first through part exposing the first control electrode and the first semiconductor pattern disposed on both sides of the first control electrode wherein the first input electrode and the first output electrode are connected to the exposed first semiconductor pattern on the both sides of the first control electrode through the first through part.

In an embodiment, the first semiconductor pattern may include a first area overlapping the first control electrode, and a second area and a third area spaced apart from each other with the first area disposed therebetween; and the first through part exposes the second area and the third area.

In an embodiment, the first through part may penetrate a first insulating layer and a second insulating layer, a first insulating layer disposed between the first control electrode and the first semiconductor pattern and a second insulating layer disposed on the first insulating layer; and the first input electrode and the first output electrode may be disposed on the second insulating layer to contact the first semiconductor pattern through the first through part.

In an embodiment, the first insulating layer may include: a first insulating pattern which overlaps the first area and the first control electrode; and a second insulating pattern exposes the second area and the third area with the first insulating pattern therebetween on a plane.

In an embodiment, at least a portion of the first insulating pattern may be connected to the second insulating pattern.

In an embodiment, the first through part may expose a side surface of the first insulating pattern and a side surface of the first control electrode.

In an embodiment, the side surface of the first insulating pattern may be aligned with the side surface of the first control electrode on a section.

In an embodiment, an area where the first through part is defined in the first insulating layer and an area where the first through part is defined in the second insulating layer may have different configuration on a plane.

In an embodiment, the area where the first through part is defined in the second insulating layer may overlap at least the first semiconductor pattern on a plane.

In an embodiment, the semiconductor device may further include second through parts penetrating at least a portion of the insulating layers; the second input electrode may be connected to the second semiconductor pattern through one of the second through parts among the second through parts; and the second output electrode may be connect to the second semiconductor pattern through another of the second through part.

In an embodiment, each of the second through parts may penetrate the first insulating layer, the second insulating layer, and a third insulating layer disposed between the second control electrode and the second semiconductor pattern among the insulating layers; and the first semiconductor pattern may be disposed on the third insulating layer and the second semiconductor pattern may be covered by the third insulating layer.

In an embodiment, the semiconductor device may further include: a first capacitor electrode disposed on the third insulating layer; and a second capacitor electrode disposed on the first capacitor electrode and forming an electric field with the first capacitor electrode, wherein the second capacitor electrodes may be spaced apart from each other with the first insulating layer disposed therebetween.

In an embodiment, the semiconductor device may further include an upper electrode disposed on the second control electrode and overlapping the second control electrode, wherein the upper electrode may be spaced apart from the second control electrode with the first insulating layer disposed therebetween and the upper electrode may be connected to the second capacitor electrode.

In an embodiment, the first through part may expose an upper surface of the first control electrode.

In an embodiment, the semiconductor device may further include a cover pattern covering the first control electrode, wherein the first through part may expose an upper surface of the cover pattern.

In an embodiment, the cover pattern may have the same configuration as the first control electrode in a plan view.

In an embodiment, the first semiconductor pattern may include an oxide semiconductor.

In an embodiment, the second semiconductor pattern may include a crystalline semiconductor.

In an embodiment, the semiconductor device may further include an organic light emitting device directly connected to the second transistor.

In an embodiment, the first through part and the second through part may be formed at the same time.

In an embodiment of the inventive concept, provided is a method of manufacturing a semiconductor device. The method includes: forming an initial first semiconductor pattern on a base substrate; forming a first insulating layer on the initial first semiconductor pattern; forming a first control electrode on the first insulating layer; forming a second insulating layer on the first insulating layer to cover the first control electrode; forming a first through part in the second insulating layer and the first insulating layer to expose at least portion of the initial first semiconductor pattern and a side surface of the first control electrode; forming a channel area on the initial first semiconductor pattern to form a first semiconductor pattern; and forming each of a first input electrode and a first output electrode on the second insulating layer to contact the first semiconductor pattern via the first through part.

In an embodiment, the forming of the first through part may use an etching process.

In an embodiment, during the forming of the first through part, the first insulating layer which is not covered by the first control electrode may be etched using the first control electrode as an etching mask.

In an embodiment, the first insulating pattern may be self-aligned with the first control electrode.

In an embodiment, the method may further include, before the forming of the second insulating layer, forming a cover pattern covering the first control electrode on the first control electrode, wherein the first through part exposes an upper surface of the cover pattern.

In an embodiment, the cover pattern may have a good etching selectivity with the second insulating layer in an etchant used during the etching process.

In an embodiment, the forming of the first semiconductor pattern may include performing plasma treatment on the exposed portion of the initial first semiconductor pattern through the first through part.

In an embodiment, the method may further include, before the forming of the initial first semiconductor pattern, forming an initial second semiconductor pattern on the base substrate; and forming a third insulating layer on the initial second semiconductor pattern, and further including, before the forming of the first control electrode, forming a channel area on the initial second semiconductor pattern to form a second semiconductor pattern, wherein the forming of the first through part may further include forming a plurality of second through parts in the first to third insulating layers to overlap the second semiconductor pattern.

In an embodiment, the first through part may expose an upper surface of the first control electrode.

In an embodiment, the forming of each of the first input electrode and the first output electrode may include: forming a conductive layer on the second insulating layer to cover the exposed first control electrode; and patterning the conductive layer to simultaneously form the first input electrode, the first output electrode, and a cover pattern spaced apart from the first input electrode and the second output electrode in a plan view to cover the first control electrode, wherein the cover pattern may have the same configuration as the first control electrode on a plane.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 4A, 4B, 4C, 4D, 4E, 4F, 4G, 4H, 4I, 4J, 4K and 4L are cross-sectional views illustrating a method of manufacturing a semiconductor device according to an embodiment of the inventive concept;

FIGS. 5A, 5B and 5C are cross-sectional views illustrating a method of manufacturing a semiconductor device according to an embodiment of the inventive concept; and FIGS. 6A, 6B, 6C, 6D, 6E and 6F are cross-sectional views illustrating a method of manufacturing a semiconductor device according to an embodiment of the inventive concept.

DETAILED DESCRIPTION

Hereinafter, the inventive concept will be described with reference to the drawings.

Figure 1:
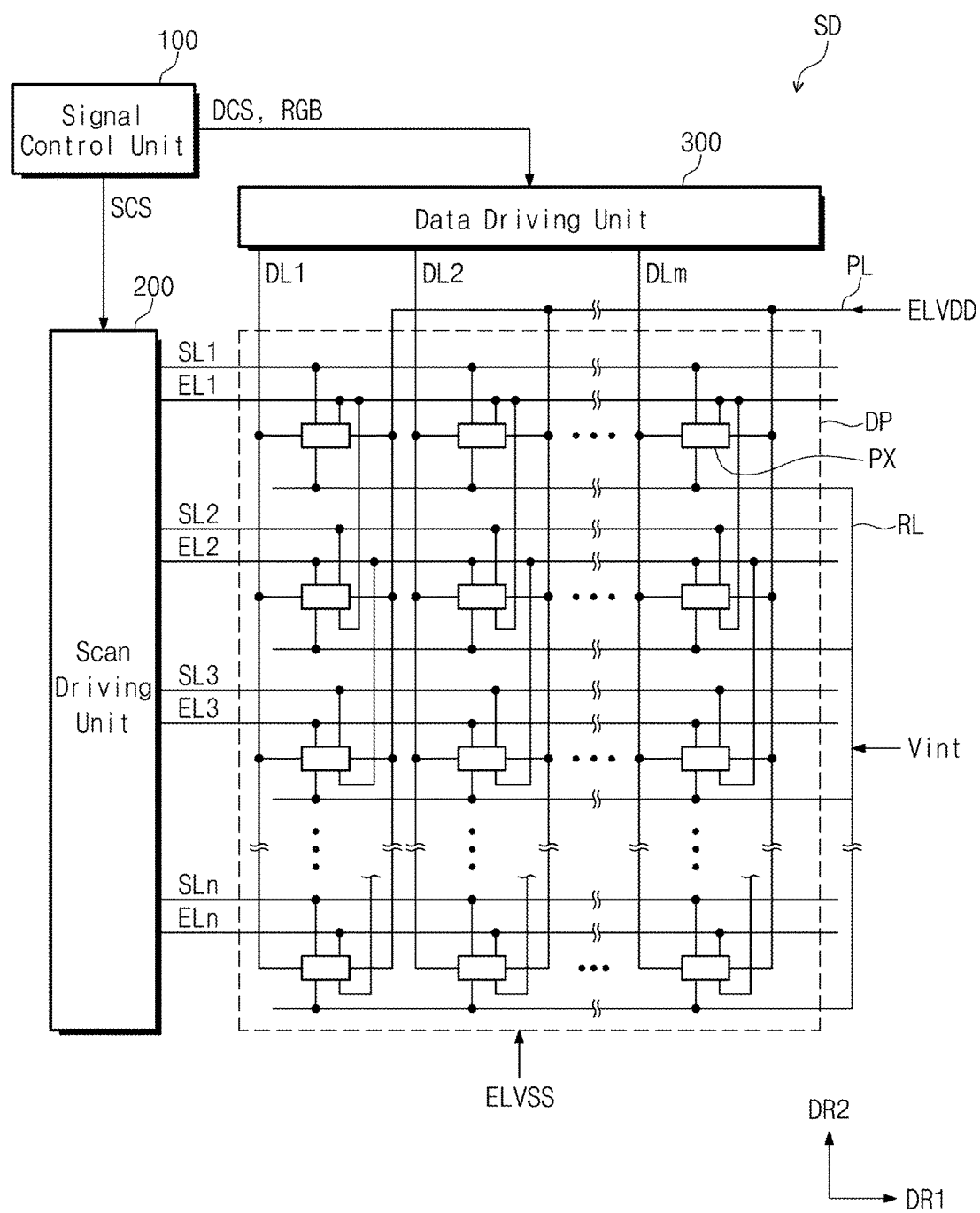
FIG. 1 is a block diagram illustrating a semiconductor device according to an embodiment of the inventive concept.

FIG. 1 is a block diagram illustrating a semiconductor device according to an embodiment of the inventive concept. A semiconductor device includes at least one semiconductor pattern. FIG. 1 illustrates a display device as one embodiment of a semiconductor device. Hereinafter, a display device SD is described exemplarily but a semiconductor device according to an embodiment of the inventive concept may include various embodiments and is not limited to any one embodiment.

As shown in FIG. 1, a display device SD includes a signal control unit 100, a scan driving unit 200, a data driving unit 300, and a display panel DP. The display panel DP displays an image according to an electrical signal.

The signal control unit 100 receives input image signals (not shown) and generates image data RGB by converting a data format of the input image signals to match the interface specifications of the scan driving unit 200. The signal control unit 100 outputs the image data RGB and various control signals DCS and SCS.

The scan driving unit 200 receives a scan control signal SCS from the signal control unit 100. The scan control signal SCS may include a vertical start signal for stating an operation of the scan driving unit 200 and a clock signal for determining the output timings of signals.

The scan driving unit 200 generates a plurality of scan signals and sequentially outputs the plurality of scan signals to a plurality of scan lines SL1 to SLn. Additionally, the scan driving unit 200 generates a plurality of light emitting control signals in response to the scan control signal SCS and outputs the plurality of light emitting control signals to a plurality of light emitting lines EL1 to ELn.

Although it is shown in FIG. 1 that scan signals and light emitting control signals are outputted from one scan driving unit 200, the inventive concept is not limited thereto. According to an embodiment of the inventive concept, scan driving units may divide and output scan signals and also divide and output light emitting control signals. Additionally, according to an embodiment of the inventive concept, the scan signals and the light emitting control signals are generated from two different units, for example, a scan driving unit 200 and a light emitting control circuit (not shown), respectively.

The data driving unit 300 receives the data control signal DCS and the image data RGB from the signal control unit 100. The data driving unit 300 converts the image data RGB into data signals and outputs the data signals to the data lines DL1 to DLm. The data signals may be analog voltages corresponding to the grayscale values of the image data RGB.

The display panel DP includes scan lines SL1 to SLn, light emitting lines EL1 to ELn, data lines DL1 to DLm, and pixels PX. The scan lines SL1 to SLn extend in a first direction DR1 and are arranged in a second direction DR2 orthogonal to the first direction DR1.

Each of the plurality of light emitting lines EL1 to ELn may be arranged parallel to a corresponding scan line among the scan lines SL1 to SLn. The data lines DL1 to DLm insulatively intersect the scan lines SL1 to SLn.

Each of the plurality of pixels PX connects to a corresponding scan line among the scan lines SL1 to SLn, a corresponding light emitting line among the light emitting lines EL1 to ELn, and a corresponding data line among the data lines DL1 to DLm.

Each of the pixels PX receives a first voltage ELVDD corresponding to a power voltage and a second voltage ELVSS having a lower level than the first voltage ELVDD. Each of the pixels PX connects to a power line PL where the first voltage ELVDD is applied. Each of the pixels PX is connected to an initialization line RL for receiving an initialization voltage Vint.

Each of the plurality of pixels PX may be electrically connected to three scan lines. For example, as shown in FIG. 1, the pixels of the second pixel row may be connected to the first to third scan lines SL1 to SL3.

Moreover, although not shown in the drawing, the display panel DP may further include a plurality of dummy scan lines. The display panel DP may further include a dummy scan line connected to the pixels PX of the first pixel row and a dummy scan line connected to the pixels PX of the nth pixel row. Additionally, pixels (hereinafter referred to as the pixels of a pixel column) connected to one data line among the data lines DL1 to DLm may be connected to each other. Adjacent two pixels among the pixels of a pixel column may be connected electrically.

Each of the plurality of pixels PX includes an organic light emitting diode (not shown) and a pixel driving circuit (not shown) for controlling the light emission of the organic light emitting diode. The pixel driving circuit may include a plurality of thin film transistors and a capacitor. At least one of the scan driving unit 200 and the data driving unit 300 may include a thin film transistor formed through the same process as the pixel driving circuit.

The scan lines SL1 to SLn, the light emitting lines EL1 to ELn, the data lines DL1 to DLm, the power line PL, the initialization line RL, the pixels PX, the scan driving unit 200, and the data driving unit 300 may be formed on a base substrate (not shown) through a plurality of times of a photolithography process. Through a plurality of times of a deposition process or a coating process, insulating layers may be formed on a base substrate (not shown). Each of the insulating layers may be a thin film for covering the entire display panel DP or include at least one insulating pattern overlapping a specific configuration of the display panel DP. The insulating layers include an organic layer and/or an inorganic layer. In addition, a sealing layer (not shown) for protecting the pixels PX may be further formed on the base substrate.

Figure 2:
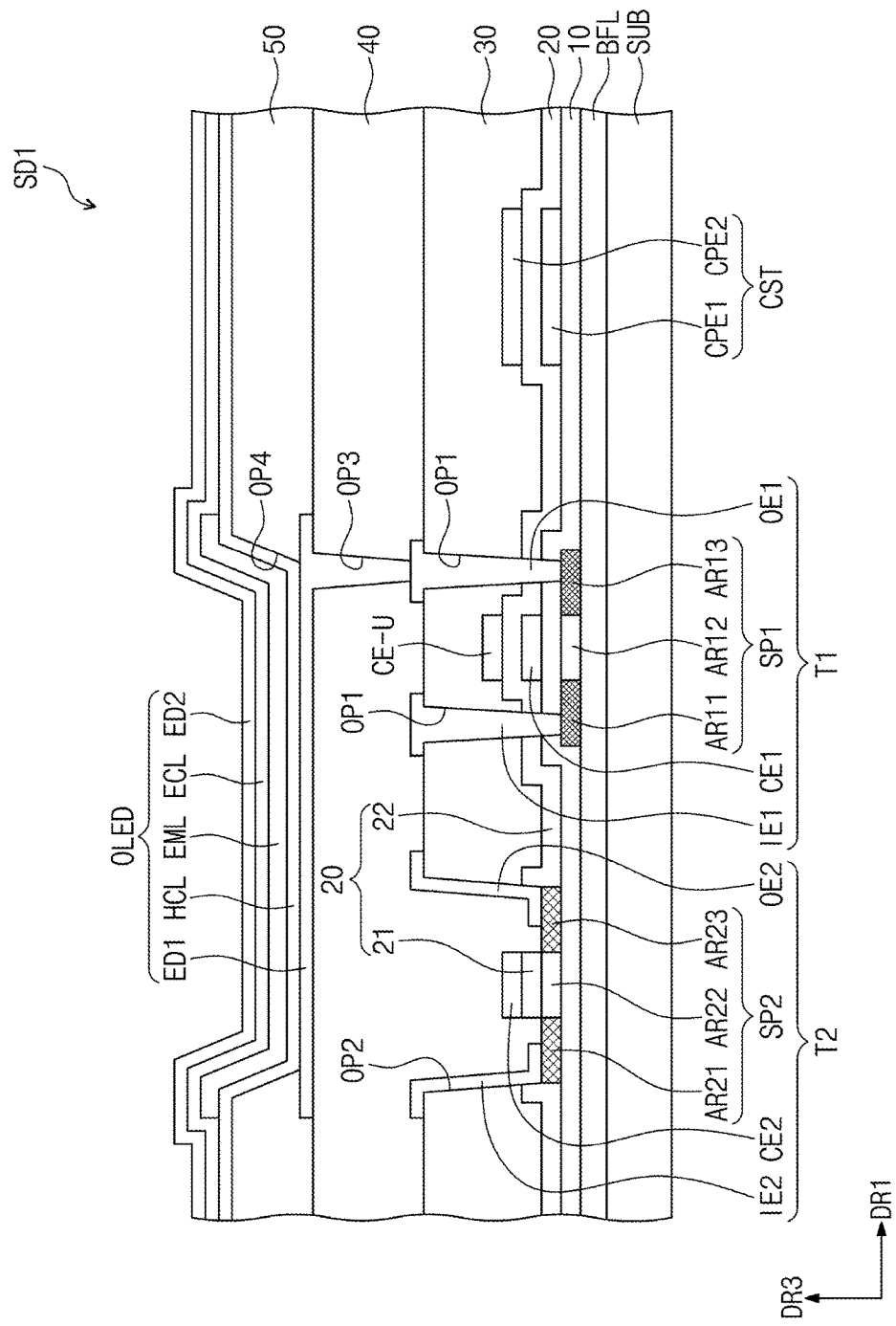
FIG. 2 is a cross-sectional view of a semiconductor device according to an embodiment of the inventive concept.

FIG. 2 is a sectional view of a semiconductor device according to an embodiment of the inventive concept. FIG. 2 illustrates a partial area of a semiconductor device SD1. An area shown in FIG. 2 may be an area corresponding to one pixel among the pixels PX shown in FIG. 1. FIG. 2 shows a cross-section that is defined by a first direction DR1 and a third direction DR3. The third direction DR3 may correspond to a thickness direction of the semiconductor device SD1.

As shown in FIG. 2, the semiconductor device SD1 includes a base substrate SUB, a first transistor T1, a second transistor T2, a capacitor CST, and an organic light emitting diode OLED. The upper surface of the base substrate SUB is defined by the first direction DR1 and the second direction DR2 (see FIG. 1).

The first transistor T1 includes a first input electrode IE1, a first output electrode OE1, a first control electrode CE1, and a first semiconductor pattern SP1. The first transistor T1 may be a driving transistor connected to the organic light emitting diode OLED. The second transistor T2 includes a second input electrode IE2, a second output electrode OE2, a second control electrode CE2, and a second semiconductor pattern SP2. The second transistor T2 may be a control transistor for turning on a pixel PX.

However, this is described exemplarily and the first transistor T1 and the second transistor T2 may be disposed at various positions. For example, at least one of the first transistor T1 and the second transistor T2 may be an element configuring one of the scan driving unit 200 (see FIG. 1) and the data driving unit 300 (see FIG. 1).

The capacitor CST includes a first capacitor electrode CPE1 and a second capacitor electrode CPE2. The first capacitor electrode CPE1 and the second capacitor electrode CPE2 are disposed spaced apart from each other with a predetermined insulating layer therebetween.

The organic light emitting device OLED includes a first electrode ED1, a first charge control layer HCL, a light emitting layer EML, a second charge control layer ECL, and a second electrode ED2. In this embodiment, the first electrode ED1, the first charge control layer HCL, the light emitting layer EML, the second charge control layer ECL, and the second electrode ED2 may respectively correspond to an anode electrode AE, a hole control layer HCL, a light emitting layer EML, an electron control layer ECL, and a cathode electrode CE, respectively. Moreover, this is just shown exemplarily, and the first electrode ED1, the first charge control layer HCL, the light emitting layer EML, the second charge control layer ECL, and the second electrode ED2 may be a cathode electrode, an electron control layer, a light emitting layer, a hole control layer, and an anode electrode, respectively.

The base substrate SUB may be a layer, a film, or a plate, where the first transistor T1, the second transistor T2, and the capacitor CST are to be disposed. The base substrate SUB may include a plastic substrate, a glass substrate, or a metallic substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin.

A buffer layer BFL may be disposed between the upper surface of the base substrate SUB and the first transistor T1 and the second transistor T2. The buffer layer BFL improves the coupling strength of the base substrate SUB and conductive patterns or semiconductor patterns. The buffer layer BFL may include one of an organic material and/or an inorganic material. Although not shown separately in the drawing, a barrier layer for preventing a foreign material from entering into the conductive patterns or the semiconductor patterns may be further disposed at the upper surface of the base substrate SUB. The buffer layer BFL and the barrier layer may be selectively disposed or may be omitted.

The first semiconductor pattern SP1 is disposed on the buffer layer BFL. The first semiconductor pattern SP1 may include a crystalline semiconductor material. For example, the first semiconductor pattern SP1 may include a polycrystalline semiconductor material such as polycrystalline silicon.

The first semiconductor pattern SP1 may include a first area AR11 and a third area AR13, all of which include an impurity, and a second area AR12 adjacent to the first area AR11 and the third area AR13. The first area AR11 and the third area AR13 may have a P-type or an N-type according to the type of an impurity.

The first area AR11 is connected to the first input electrode IE1 and the third area AR13 is connected to the first output electrode OE1. The second area AR12 may be disposed between the first area AR11 and the third area AR13 and overlap the first control electrode CE1 in a plan view. The second area AR12 may be a channel area of the first transistor T1.

The second area AR12 that becomes the channel area of the first transistor T1 may include an intrinsic polycrystalline semiconductor material. Accordingly, the first transistor T1 may have an improved mobility and function as a driving element with a high reliability. Holes or electrons may move in the channel area of the first semiconductor pattern SP1 according to a structure of the first semiconductor pattern SP1.

A first insulating layer 10 is disposed on the first semiconductor pattern SP1. The first insulating layer 10 may include at least one of an inorganic material and/or an organic material. For example, the first insulating layer 10 may include an inorganic insulation material such as SiOx, SiNx, SiON, and SiOF or an organic insulation material, and may be a single layer or multilayer including at least one of the materials.

The first insulating layer 10 may be disposed on the buffer layer BFL to cover at least a portion of the first semiconductor pattern SP1. Moreover, this is shown exemplarily, and the first insulating layer 10 may be an insulating pattern overlapping the second area AR12 in a plan view. The first insulating layer 10 according to an embodiment of the inventive concept may have various forms and is not limited to any one embodiment.

The first control electrode CE1, the first capacitor electrode CPE1, and the second semiconductor pattern SP2 are disposed on the first insulating layer 10. The first control electrode CE1 and the first capacitor electrode CPE1 may be disposed on the same layer.

The first control electrode CE1 overlaps at least the second area AR12. The first control electrode CE1 is spaced apart from the first semiconductor pattern SP1 with the first insulating layer 10 interposed therebetween.

The first capacitor electrode CPE1 defines one electrode of the capacitor CST. In this embodiment, the first capacitor electrode CPE1 may be electrically connected to the first control electrode CE1. Alternatively, the first capacitor electrode CPE1 and the first control electrode CE1 may be a conductive pattern in an integrated form.

The second semiconductor pattern SP2 may include an oxide semiconductor. For example, the oxide semiconductor may include a metal oxide of Zn, In, Ga, Sn, and Ti or a compound of a metal of Zn, In, Ga, Sn, and Ti and an oxide thereof.

Moreover, the second semiconductor pattern SP2 may include a crystallized oxide semiconductor. The crystal of the oxide semiconductor may have an orientation in a vertical direction. However, this is described exemplarily and the second semiconductor pattern SP2 may include an amorphous oxide semiconductor.

The second semiconductor pattern SP2 may include a first area AR21 and a third area AR23, all of which include an impurity, and a second area AR22 adjacent to the first area AR21 and the third area AR23. The first area AR21 and the third area AR23 are spaced apart from each other with the second area AR22 interposed therebetween. The second area AR22 may be a channel area of the second transistor T2. The second area AR22 may be a path through which electrons move or a path through which current flows according to a structure of the second semiconductor pattern SP2.

In relation to the second semiconductor pattern SP2, the impurity may be a metal or hydrogen. For example, the first area AR21 and the third area AR23 may include metal materials reduced from a metal oxide that constitutes the second area AR22. The metal concentration in the first area AR21 and the third area AR23 adjacent to the second area AR22 is lower than that in the first area AR21 and the third area AR23 far off from the second area AR22. Alternatively, the metal materials may be distributed at the interface of the second input electrode IE2 and the first area AR21 and the interface of the second output electrode OE2 and the third area AR23.

Alternatively, for example, the first area AR21 and the third area AR23 may have a relatively higher hydrogen concentration than the second area AR22. The second semiconductor pattern SP2 according to an embodiment of the inventive concept may be provided in various forms and is not limited to any one embodiment.

The channel area of the second transistor T2 may have a relatively less leakage current than the channel area of the first transistor T1 because the second semiconductor pattern SP2 includes an oxide semiconductor. Accordingly, the second transistor T2 may function as a switching element having improved on-off characteristics.

A second insulating layer 20 may be disposed on the first capacitor electrode CPE1, the first control electrode CE1, and the second semiconductor pattern SP2. The second insulating layer 20 may include an organic material and/or an inorganic material. For example, the second insulating layer 20 may include an inorganic insulation material such as SiOx, SiNx, SiON, and SiOF or an organic insulation material, and may be a single layer or multilayer including at least one of the materials.

The second insulating layer 20 may include a first insulating pattern 21 and a second insulating pattern 22 separated from each other on a plane that is defined by the first direction DR1 and the third direction DR3. The first insulating pattern 21 is disposed on the second semiconductor pattern SP2. The first insulating pattern 21 may overlap at least the second area AR22 of the second semiconductor pattern SP2. The first insulating pattern 21 may cover the second area AR22 of the second semiconductor pattern SP2 and expose the first area AR21 and the third area AR23.

The second insulating pattern 22 is disposed on the first insulating layer 10 to cover the first control electrode CE1 and the first capacitor electrode CPE1. The second insulating pattern 22 may contact the first insulating layer 10. The second insulating pattern 22 may cover a side surface of the second semiconductor pattern SP2.

The second insulating pattern 22 may cover the first control electrode CE1 and the first capacitor electrode CPE1 at the same time. A portion covering the first control electrode CE1 and a portion covering the first capacitor electrode CPE1 may be connected to each other to form the second insulating pattern 22.

Moreover, the first insulating pattern 21 and the second insulating pattern 22 may be patterns separated from each other in a plan view. Alternatively, although not shown in the drawing, the second insulating pattern 22 may be connected to a portion (not shown) of the first insulating pattern 21 to configure the second insulating layer 20 in an integrated form.

A second control electrode CE2, a second capacitor electrode CPE2, and an upper electrode CE-U are disposed on the second insulating layer 20. The second control electrode CE2 may be disposed on the first insulating pattern 21 of the second insulating layer 20. The second control electrode CE2 overlaps at least the first insulating pattern 21. The second control electrode CE2 overlaps the second area AR22 of the second semiconductor pattern SP2 and non-overlaps each of the first area AR21 and the third area AR23. The second control electrode CE2 may have the same form as the second area AR22 of the second semiconductor pattern SP2 in a plan view.

The second capacitor electrode CPE2 is disposed on the second insulating pattern 22 of the second insulating layer 20. The second capacitor electrode CPE2 is disposed to overlap the first capacitor electrode CPE1 in a plan view. The second capacitor electrode CPE2 defines another electrode of a capacitor.

The upper electrode CE-U is disposed on the second insulating pattern 22 of the second insulating layer 20. The upper electrode CE-U and the second capacitor electrode CPE2 may be disposed on the same layer. The upper electrode CE-U may overlap the first control electrode CE1 in a plan view.

The upper electrode CE-U may receive an electrical signal different from that of the first control electrode CE1. The upper electrode CE-U according to an embodiment of the inventive concept may be electrically connected to the second capacitor electrode CPE2. Additionally, the upper electrode CE-U and the second capacitor electrode CPE2 may be a conductive pattern having an integrated form.

A third insulating layer 30 is disposed on the second insulating layer 20. The third insulating layer 30 may contact the second insulating layer 20 and cover the upper electrode CE-U and the second capacitor electrode CPE2. The third insulating layer 30 may include an organic material and/or an inorganic material.

Moreover, the third insulating layer 30 may have a relatively greater thickness than the first insulating layer 10 or the second insulating layer 20. The third insulating layer 30 may provide a flat surface at the upper sides of the upper electrode CE-U and the second capacitor electrode CPE2.

The first input electrode IE1, the first output electrode OE1, the second input electrode IE2, and the second output electrode OE2 are disposed on the third insulating layer 30. The first input electrode IE1, the first output electrode OE1, the second input electrode IE2, and the second output electrode OE2 overlap the first area AR11 and the third area AR13 of the first semiconductor pattern SP1 and the first area AR21 and the third area AR23 of the second semiconductor pattern SP2, respectively. Each of the first input electrode IE1, the first output electrode OE1, the second input electrode IE2, and the second output electrode OE2 may be connected to the first area AR11 and the third area AR13 of the first semiconductor pattern SP1 and the first area AR21 and the third area AR23 of the second semiconductor pattern SP2 through parts formed through at least a portion of the first insulating layer 10, the second insulating layer 20, and the third insulating layer 30.

In more detail, the first input electrode IE1 and the first output electrode OE1 are connected to the first area AR11 and the third area AR13 of the first semiconductor pattern SP1, respectively, through a first through part OP1. The first through part OP1 may be provided in plurality. The first through part OP1 is formed through the first insulating layer 10, the second insulating layer 20, and the third insulating layer 30.

The second input electrode IE2 and the second output electrode OE2 are connected to the first area AR21 and the third area AR23 of the second semiconductor pattern SP2, respectively, through a second through part OP2. The second through part OP2 is formed through the third insulating layer 30 and the second insulating layer 20.

At this point, an area where the second through part OP2 is defined in the third insulating layer 30 and area where the second through part OP2 is defined in the second insulating layer 20 may have different forms in a plan view. An area where the second through part OP2 is defined in the third insulating layer 30 may overlap at least the second semiconductor pattern SP2. A cross-sectional area of the second through part OP2 in a plan view may be greater than a cross-sectional area of the second semiconductor pattern SP2 in a plan view. Accordingly, the third insulating layer 30 may non-overlap the second semiconductor pattern SP2 in a plan view.

An area where the second through part OP2 is defined in the second insulating layer 20 may overlap a portion of an area where the second through part OP2 is defined in the third insulating layer 30 in a plan view. For example, an area where the second through part OP2 is defined in the second insulating layer 20 may selectively expose the second semiconductor pattern SP2.

An area where the second through part OP2 is defined in the second insulating layer 20 exposes the first area AR21 and the third area AR23 of the second semiconductor pattern SP2. Accordingly, the second insulating layer 20 may be divided into the first insulating pattern 21 overlapping the second control electrode CE2 and the second area AR22 and the second insulating pattern 22 overlapping the third insulating layer 30.

The second through part OP2 may be a single through hole. However, the second through part OP2 may be defined to have a form on another plane according to the second insulating layer 20 and the third insulating layer 30. Through one second through part OP2, both the first area AR21 and the third area AR23 of the second semiconductor pattern SP2 may be exposed.

At this point, the second through part OP2 may expose the upper surface and side surface of the second control electrode CE2 and the side surface of the first insulating pattern 21. A side surface of the first insulating pattern 21 and a side surface of the second control electrode CE2 may be aligned on a cross-sectional view. The second input electrode IE2 and the second output electrode OE2 are connected to the second semiconductor pattern SP2 through one second through part OP2.

Moreover, although not shown in the drawing, an area where the second through part OP2 is defined in the third insulating layer 30 and area where the second through part OP2 is defined in the second insulating layer 20 may have the same configuration in a plan view. At this point, the third insulating layer 30 may be divided into a portion corresponding to the first insulating pattern 21 and a portion corresponding to the second insulating pattern 22.

Moreover, at this point, the second through part OP2 may expose both the first area AR21 and the third area AR23 and may expose a side surface of the second control electrode CE2 and a side surface of the first insulating pattern 21 at the same time. As long as the first area AR21 and the third area AR23 of the second semiconductor pattern SP2, a side surface of the second control electrode CE2, and a side surface of the first insulating pattern 21 are exposed, the second through part OP2 may include various embodiments, but is not limited one embodiment.

The first input electrode IE1, the first output electrode OE1, the second input electrode IE2 and the second output electrode OE2 are formed on the third insulating layer 30. The first input electrode IE1 and the first output electrode OE1 are connected to the first area AR11 and the third area AR13 of the first semiconductor pattern SP1, respectively, through the first through part OP1. The second input electrode IE2 and the second output electrode OE2 are connected to the first area AR21 and the third area AR23 of the second semiconductor pattern SP2, respectively, through the second through part OP2.

A fourth insulating layer 40 is disposed on the third insulating layer 30. The fourth insulating layer 40 includes an inorganic material and/or an organic material. A third through part OP3 may be formed through the fourth insulating layer 40. The third through part OP3 may be defined in an area overlapping the first output electrode OE1.

At least a portion of the fourth insulating layer 40 may be disposed on the second through part OP2 to fill the second through part OP2. At least a portion of the fourth insulating layer 40 may directly contact a portion of the second semiconductor pattern SP2 and a side surface of the first insulating pattern 21. A portion exposed by the second input electrode IE2 in the first area AR21 of the second semiconductor pattern SP2 and a portion exposed by the second output electrode OE2 in the third area AR23 of the second semiconductor pattern SP2 may directly contact the fourth insulating layer 40.

A first electrode ED1 is disposed on the fourth insulating layer 40. The first electrode ED1 may be connected to the first output electrode OE1 of the first transistor T1 through the third through part OP3. The first electrode ED1 may include a conductive material. The first electrode ED1 may be a reflective or transmissive-type electrode and is not limited to an embodiment.

A fifth insulating layer 50 is disposed on the fourth insulating layer 40. The fifth insulating layer 50 may include an organic layer and/or an inorganic layer. A predetermined opening part OP4 is defined in the fifth insulating layer 50. The opening part OP4 exposes at least a portion of the first electrode ED1.

A first charge control layer HCL, a light emitting layer EML, a second charge control layer ECL, and a second electrode ED2 are sequentially stacked on the first electrode ED1. The first electrode ED1, the first charge control layer HCL, the light emitting layer EML, the second charge control layer ECL, and the second electrode ED2 may form an organic light emitting device OLED.

The first charge control layer HCL may include a hole injection/transfer material, and the second charge control layer ECL may include an electron injection/transfer material. Alternatively, the first charge control layer HCL may include an electron injection/transfer material, and the second charge control layer ECL may include a hole injection/transfer material. Each of the first charge control layer HCL and the second charge control layer ECL may include at least one layer.

The light emitting layer EML includes a light emitting material. The light emitting layer EML may be a light emitting pattern overlapping the opening part OP4. The light emitting layer EML may include at least one layer. Moreover, although not shown in the drawing, the light emitting layer may be provided more than one and the plurality of light emitting layers may be disposed on different layers.

The second electrode ED2 is disposed on the second charge control layer ECL. The second electrode ED2 overlaps at least the first electrode ED1. In this embodiment, the second electrode ED2 may overlap the entire area of the fifth insulating layer 50.

The second electrode ED2 may include a conductive material. The second electrode E2D may be a transmissive-type electrode or a reflective-type electrode. The organic light emitting diode OLED generates light from the light emitting layer EML by using a voltage difference between the first electrode ED1 and the second electrode ED2.

Moreover, although not shown in the drawing, the organic light emitting diode OLED may further include at least one charge generation layer disposed between the first electrode ED1 and the second electrode ED2.

Additionally, although not shown in the drawing, the semiconductor device SD1 may further include an organic layer and/or an inorganic layer disposed on the second electrode ED2.

As the semiconductor device SD1 includes a single second through part OP2, the exposure of the first insulating pattern 21 self-aligned by the second control electrode CE2 and the exposure of the second semiconductor pattern SP2 for the connection of the second input electrode IE2 and the second output electrode OE2 may be implemented through one through part at the same time. Accordingly, the process is simplified and the insulating layers are formed stably during the manufacturing processes, so that the process reliability of an element may be improved. Detailed description for this will be made later.

Figure 3:
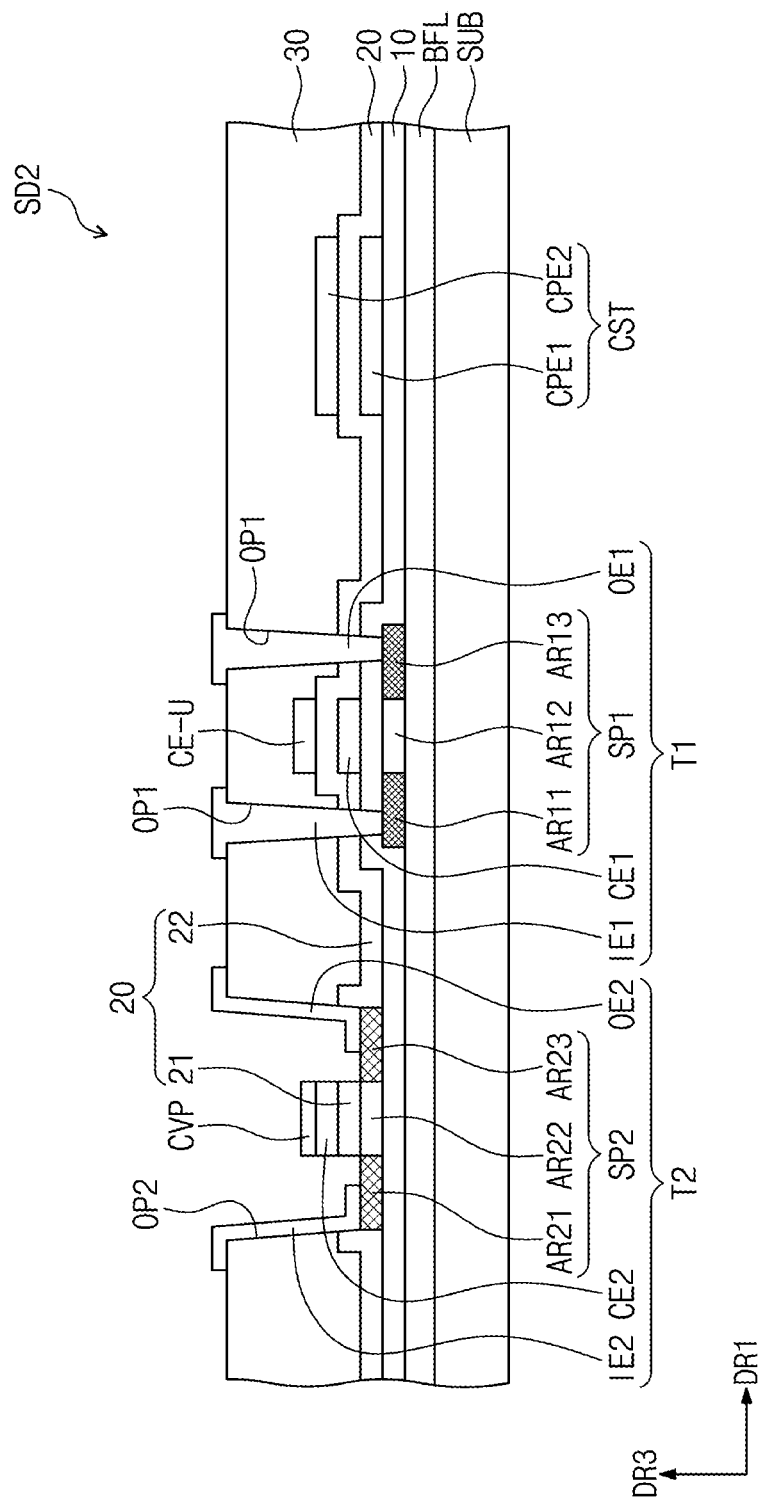
FIG. 3 is a cross-sectional view of a semiconductor device according to an embodiment of the inventive concept.

FIG. 3 is a cross-sectional view of a semiconductor device according to an embodiment of the inventive concept. FIG. 3 shows a cross-section that is defined by a first direction DR1 and a third direction DR3 of a semiconductor device SD2. Hereinafter, the semiconductor device SD2 will be described with reference to FIG. 3. Moreover, like reference numerals refer to like elements throughout FIGS. 1 to 3 and their overlapping descriptions are omitted.

As shown in FIG. 3, the semiconductor device SD2 includes a first transistor T1, a second transistor T2, and a capacitor CST. The semiconductor device SD2 may correspond to some components of the semiconductor device SD1 shown in FIG. 2. Alternatively, the semiconductor device SD2 may be a part configuring the scan driving unit 200 or the data driving unit 300 shown in FIG. 1.

Descriptions for the first transistor T1, the second transistor T2, and the capacitor CST overlap the above descriptions and thus will be omitted. As shown in FIG. 3, the semiconductor device SD2 may further include a cover pattern CVP. The cover pattern CVP may be disposed on the second transistor T2.

In more detail, the cover pattern CVP is disposed on the second control electrode CE2. The cover pattern CVP overlaps the second control electrode CE2 in a plan view. The cover pattern CVP may be directly disposed on the second control electrode CE2.

The cover pattern CVP is disposed to overlap the first insulating pattern 21. Additionally, the cover pattern CVP is disposed to overlap the second area AR22 of the second semiconductor pattern SP2. The cover pattern CVP and the second area AR22 may have the same configuration in a plan view.

The cover pattern CVP may include various materials. For example, the cover pattern CVP may include a conductive material. For example, the conductive material may be metal, conductive oxide, or conductive polymer. For example, the cover pattern CVP may include the same material as the second control electrode CE2, the second input electrode IE2, or the second output electrode OE2.

Alternatively, for example, the cover pattern CVP may include an organic layer and/or an inorganic layer. The cover pattern CVP may include a material having a good etching selectively with the second input electrode IE2 and the second output electrode OE2 in an etchant. As the cover pattern CVP includes a material having a good etching selectivity with respect to an etchant of the second input electrode IE2 and the second output electrode OE2, process reliability may be improved. Detailed description for the formation of the cover pattern CVP will be made later.

FIGS. 4A to 4L are cross-sectional views illustrating a method of manufacturing a semiconductor device according to an embodiment of the inventive concept. FIGS. 4A to 4L exemplarily show the method of manufacturing the semiconductor device SD1 shown in FIG. 2.

Referring to FIGS. 4A to 4L, the method of manufacturing the semiconductor device SD1 is described. Like reference numerals refer to like elements throughout FIGS. 1 to 4L and overlapping descriptions are omitted.

As shown in FIG. 4A, a buffer layer BFL and an initial first semiconductor pattern SP1-A are formed on a substrate SUB. The buffer layer BFL may be formed by depositing, coating, or printing an inorganic material and/or an organic material on the base substrate SUB. Moreover, in relation to the semiconductor device SD1 according to this embodiment of the inventive concept, the buffer layer BFL may be omitted.

Then, the initial first semiconductor pattern SP1-A is formed on the substrate SUB or the buffer layer BFL. After a semiconductor material is deposited, the semiconductor material is patterned using a conventional photolithography technique to form the initial first semiconductor pattern SP1-A. The initial first semiconductor pattern SP1-A may be further heat treated to form a crystallized first semiconductor pattern.

Then, as shown in FIG. 4B, an initial first insulating layer 10-A and a conductive layer CL are formed. The initial first insulating layer 10-A may be formed by depositing, coating, or printing an inorganic material and/or an organic material on the base substrate SUB or the buffer layer BFL. The initial first insulating layer 10-A may cover the initial first semiconductor patterns SP1-A. Then, by depositing a conductive material on the initial first insulating layer 10-A, the conductive layer CL is formed.

Then, as shown in FIG. 4C, after a first control electrode CE1 and a first capacitor electrode CPE1 are formed, a first semiconductor pattern SP1 is formed. The first control electrode CE1 and the first capacitor electrode CPE1 may be formed by patterning the conductive layer CL. The first control electrode CE1 and the first capacitor electrode CPE1 may be patterned at the same time by using the same mask. Moreover, this is described exemplarily, and the first control electrode CE1 and the first capacitor electrode CPE1 may be patterned separately by using different masks.

Then, the first semiconductor pattern SP1 is formed by doping an impurity DM to the initial first semiconductor pattern SP1-A. The impurity DM, for example, may be doped to the initial first semiconductor pattern SP1-A through a diffusion process or an ion implantation process, but is not limited to a specific method.

The impurity DM may include various materials. For example, the impurity DM may include a trivalent element to form a P-type semiconductor. Alternatively, the impurity DM may include a pentavalent element to form an N-type semiconductor.

Because the first control electrode CE1 is disposed on the second area AR12, the impurity DM is not included in the second area AR12. Thus, the first semiconductor pattern SP1 including a first area AR11 which is doped with the impurity DM, a second area AR12 which is not doped with the impurity DM, and a third area AR13 which is doped with the impurity DM are formed. Accordingly, the first area AR11 and the third area AR13 of the first semiconductor pattern SP1 have the impurity DM of a relatively higher concentration than the second area AR12.

Then, as shown in FIG. 4D, an initial second semiconductor pattern SP2-A is formed on the initial first insulating layer 10-A. After a material layer including an oxide semiconductor is formed on the initial insulating layer 10-A, the oxide semiconductor is patterned by a conventional photolithography technique to form the initial second semiconductor pattern SP2-A. The oxide semiconductor may include a metal oxide of Zn, In, Ga, Sn, and Ti or a compound of a metal of Zn, In, Ga, Sn, and Ti and an oxide thereof. In more detail, the oxide semiconductor may include ZnO, ZTO, ZIO, InO, TiO, IGZO, and IZTO.

Then, as shown in FIG. 4E, an initial second insulating layer 20-A is formed on the initial first insulating layer 10-A. The initial second insulating layer 20-A covers the entire areas of the first control electrode CE1, the first capacitor electrode CPE1, and the second semiconductor pattern SP2-A. The initial second insulating layer 20-A may be formed by depositing, coating, or printing an organic material or an inorganic material on the initial first insulating layer 10-A.

Then, as shown in FIG. 4F, after a second control electrode CE2, an upper electrode CE-U, and a second capacitor electrode CPE2 are formed on the initial second insulating layer 20-A, an initial third insulating layer 30-A is formed. After a conductive material is deposited on the initial second insulating layer 20-A, the second control electrode CE2, the upper electrode CE-U, and the second capacitor electrode CPE2 may be formed by a conventional photolithography technique. The second control electrode CE2, the upper electrode CE-U, and the second capacitor electrode CPE2 may be patterned at the same time by using one mask. Accordingly, process costs may be reduced and a process time may be shortened.

Moreover, this is described exemplarily, and the second control electrode CE2 and the second capacitor electrode CPE2 may be formed on different layers by using separate process steps. Additionally, the formation of the upper electrode CE-U may be omitted.

Then, an initial third insulating layer 30-A is formed on the initial second insulating layer 20-A. The initial third insulating layer 30-A may be formed by depositing, coating, or printing an organic material and/or an inorganic material on the initial second insulating layer 20-A. The initial third insulating layer 30-A is formed to cover the entire areas of the second control electrode CE2, the upper electrode CE-U, and the second capacitor electrode CPE2.

Figure 4G:
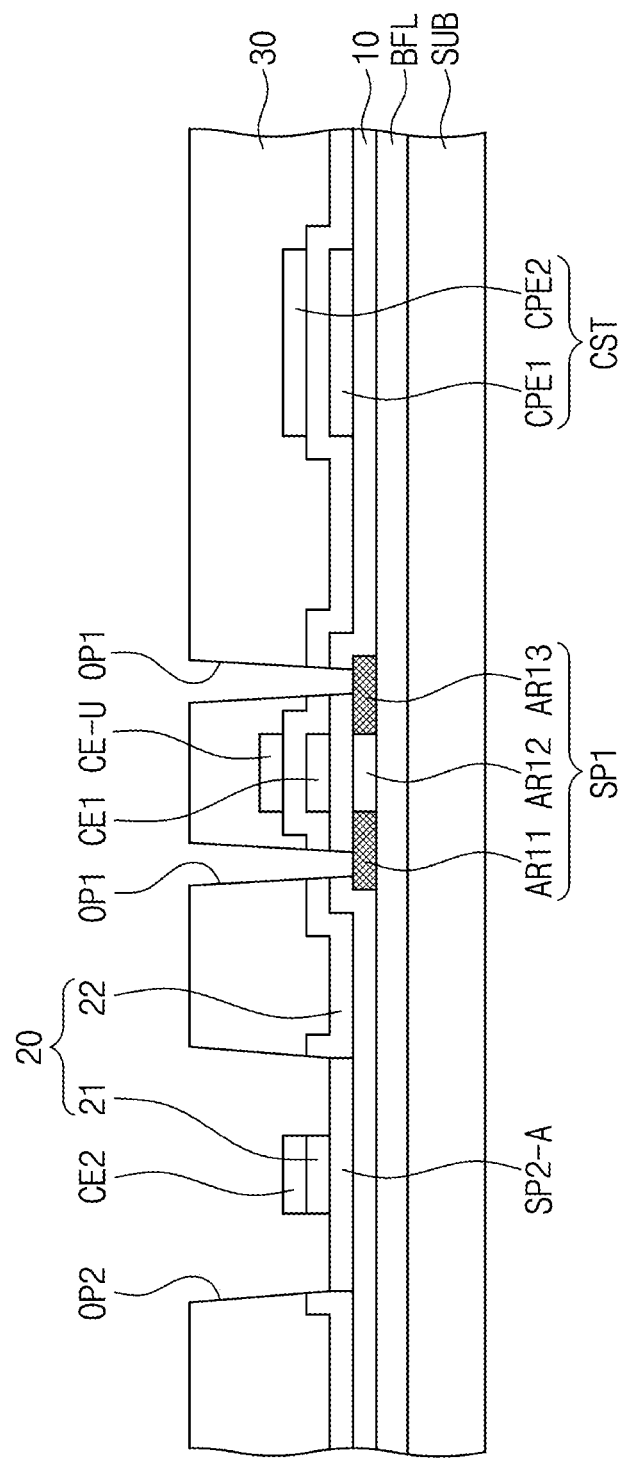

Then, as shown in FIG. 4G, first to third insulating layers 10, 20, and 30 are formed by etching the initial first insulating layer 10-A, the initial second insulating layer 20-A, and the initial third insulating layer 30-A. A first through part OP1 and a second through part OP2 are defined in the first to third insulating layers 10, 20, and 30.

The first through part OP1 may be provided in plurality. Each of the first through parts OP1 is formed in the first insulating layer 10, the second insulating layer 20, and the third insulating layer 30. Each of the first through parts OP1 overlaps the first area AR11 and the third area AR13 of the first semiconductor pattern SP1. The first area AR11 and the third area AR13 of the first semiconductor pattern SP1 are exposed by the first through parts OP1 separated from each other.

The second through part OP2 may be provided in single. The second through part OP2 is formed in the second insulating layer 20 and the third insulating layer 30. A side surface of the first insulating pattern 21 may be exposed by the second through part OP2.

At this point, an etching liquid or an etching gas may selectively etch the initial first to third insulating layers 10-A, 20-A, and 30-A and may not etch the second control electrode CE2. Accordingly, a portion of the initial second insulating layer 20-A may be patterned as a first insulating pattern 21 by using the second control electrode CE2 as a mask. A portion of the initial second insulating layer 20-A is separated from the first insulating pattern 21 and defined as a second insulating pattern 22.

The second through part OP2 is defined to overlap at least the initial second semiconductor pattern SP2-A. At this point, an area disposed on the second control electrode CE2 in the initial third insulating layer 30-A may be removed. Accordingly, the second through part OP2 exposes the initial second semiconductor pattern SP2-A and the second control electrode CE2.

The initial second semiconductor pattern SP2-A is exposed by a single through part. Both side areas spaced from each other with an area overlapping the second control electrode CE2 in the second semiconductor pattern SP2-A therebetween may be exposed by one through part. Accordingly, through an operation of forming a single second through part OP2, processes for patterning the first insulating pattern 21 and exposing a partial area of the initial second semiconductor pattern SP2-A may be performed at the same time.

Figure 4H:
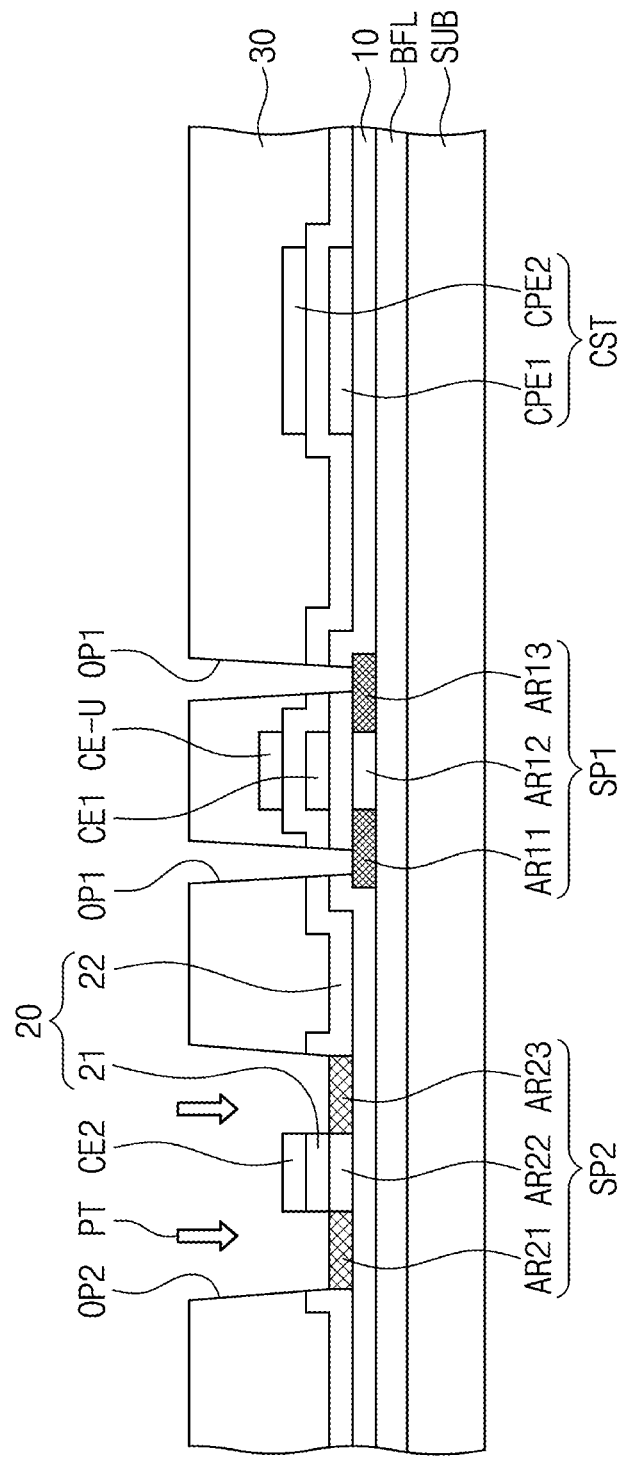

Then, as shown in FIG. 4H, a second semiconductor pattern SP2 is formed through plasma treatment PT. Areas exposed by the second through part OP2 and the first insulating pattern 21 in the initial second semiconductor pattern SP2-A may become a first area AR21 and a third area AR23 by plasma treatment PT, and an area covered by the first insulating pattern 21 may become a second area AR22.

The plasma treatment PT may use a gas including a reducing material such as hydrogen. By the plasma treatment PT, a portion of the initial second semiconductor pattern SP2-A is reduced and becomes the first area AR21 and the third area AR23. Accordingly, a metal reduced from a metal oxide that constitutes the initial second semiconductor pattern SP2-A may be formed in the first area AR21 and the third area AR23.

Moreover, this is described exemplarily and the plasma treatment PT may be omitted. At this point, the initial second semiconductor pattern SP2-A may be reduced during an etching process for forming the second through part OP2 and may be formed as the second semiconductor pattern SP2.

According to the inventive concept, as operations for forming the first insulating pattern 21 and the second through parts OP2 are performed at the same time, the first insulating layer 10 or the second insulating layer 20 in another area other than the second through parts OP2 may not be damaged during an operation for forming the first insulating pattern 21. According to the inventive concept, by performing the patterning operation of the first insulating pattern 21 after the initial third insulating layer 30-A is formed, reliability may be improved during the processing of the first insulating layer 10 and the second insulating layer 20.

Figure 4I:
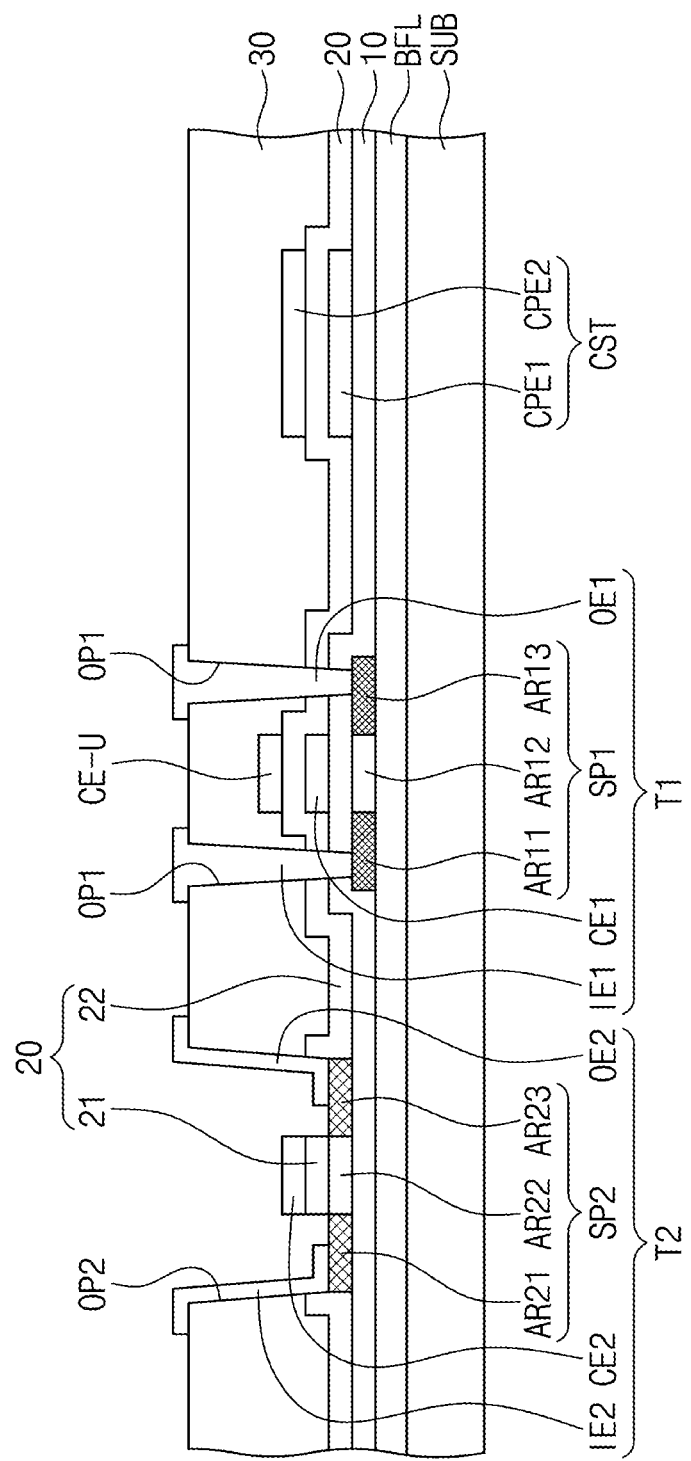

Then, as shown in FIG. 4I, a first input electrode IE1, a first output electrode OE1, a second input electrode IE2, and a second output electrode OE2 are formed on the third insulating layer 30. After a layer including a conductive material is formed on the third insulating layer 30, the conductive material is patterned by a conventional photolithography technique to form the first input electrode IE1, the first output electrode OE1, the second input electrode IE2, and the second output electrode OE2.

Each of the first input electrode IE1 and the first output electrode OE1 may be formed to overlap the first through parts OP1. Each of the first input electrode IE1 and the first output electrode OE1 may fill the first through parts OP1. The first input electrode IE1 and the first output electrode OE1 are connected to the first area AR11 of the first semiconductor pattern SP1 and the third area AR13 of the first semiconductor pattern SP1, respectively, through the first through parts OP1 to constitute a first transistor T1.

The second input electrode IE2 and the second output electrode OE2 are disposed at the second through part OP2. The second input electrode IE2 is disposed in a partial area of the second through part OP2 and the second output electrode OE2 is disposed in another partial area of the second through part OP2. The second input electrode IE2 and the second output electrode OE2 may be disposed spaced apart from each other in the second through part OP2.

The second input electrode IE1 is connected to the first area AR21 of the second semiconductor pattern SP2 and the second output electrode OE2 is connected to the third area AR23 of the second semiconductor pattern SP2 to constitute a second transistor T2. The second input electrode IE2 is disposed along the upper surface of the third insulating layer 30, the side surface of the third insulating layer 30 that defines the second through part OP2, and the first area AR21 of the second semiconductor pattern SP2. The second output electrode OE2 is disposed along the upper surface of the third insulating layer 30, the side surface of the third insulating layer 30 that defines the second opening part OP2, and the third area AR23 of the second semiconductor pattern SP2.

Figure 4J:
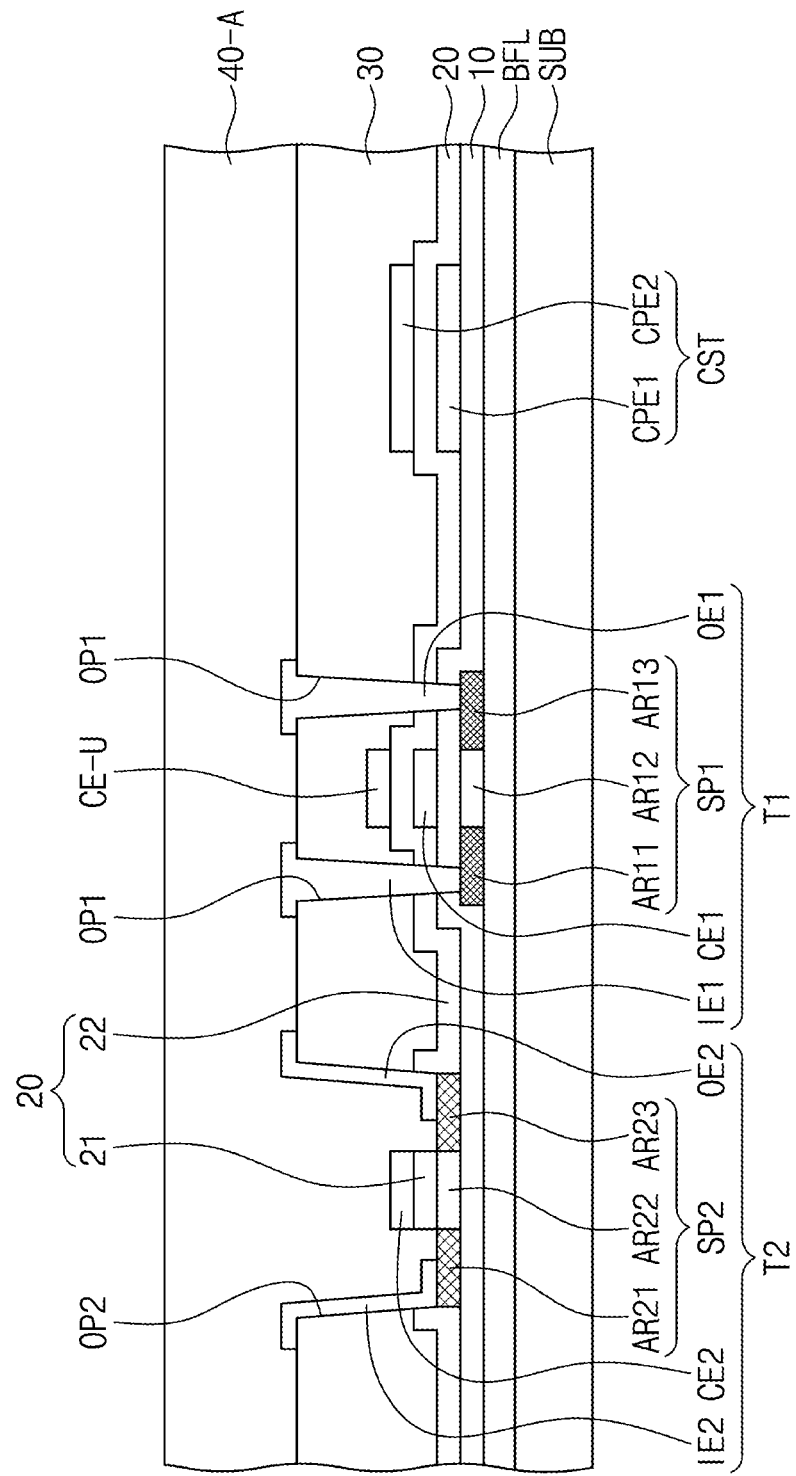

Then, as shown in FIG. 4J, an initial fourth insulating layer 40-A is formed on the third insulating layer 30. The initial fourth insulating layer 40-A may be formed by depositing, coating, or printing an inorganic layer and/or an organic layer on the third insulating layer 30.

The initial fourth insulating layer 40-A may fill the upper surface of the third insulating layer 30 and the second opening part OP2. The initial fourth insulating layer 40-A may contact the upper surface of the second input electrode IE2, the upper surface of the second output electrode OE2, the upper surface of the first control electrode CE1, a side surface of the first insulating pattern 21, and a portion of the first area AR21 and a portion of the third area AR23 in the second semiconductor pattern SP2. The initial fourth insulating layer 40-A is formed spaced apart from the second capacitor electrode CPE2 and the upper electrode CE-U with the third insulating layer 30 disposed therebetween. Unlike this, the initial fourth insulating layer 40-A may be formed to contact the second control electrode CE2.

Figure 4K:
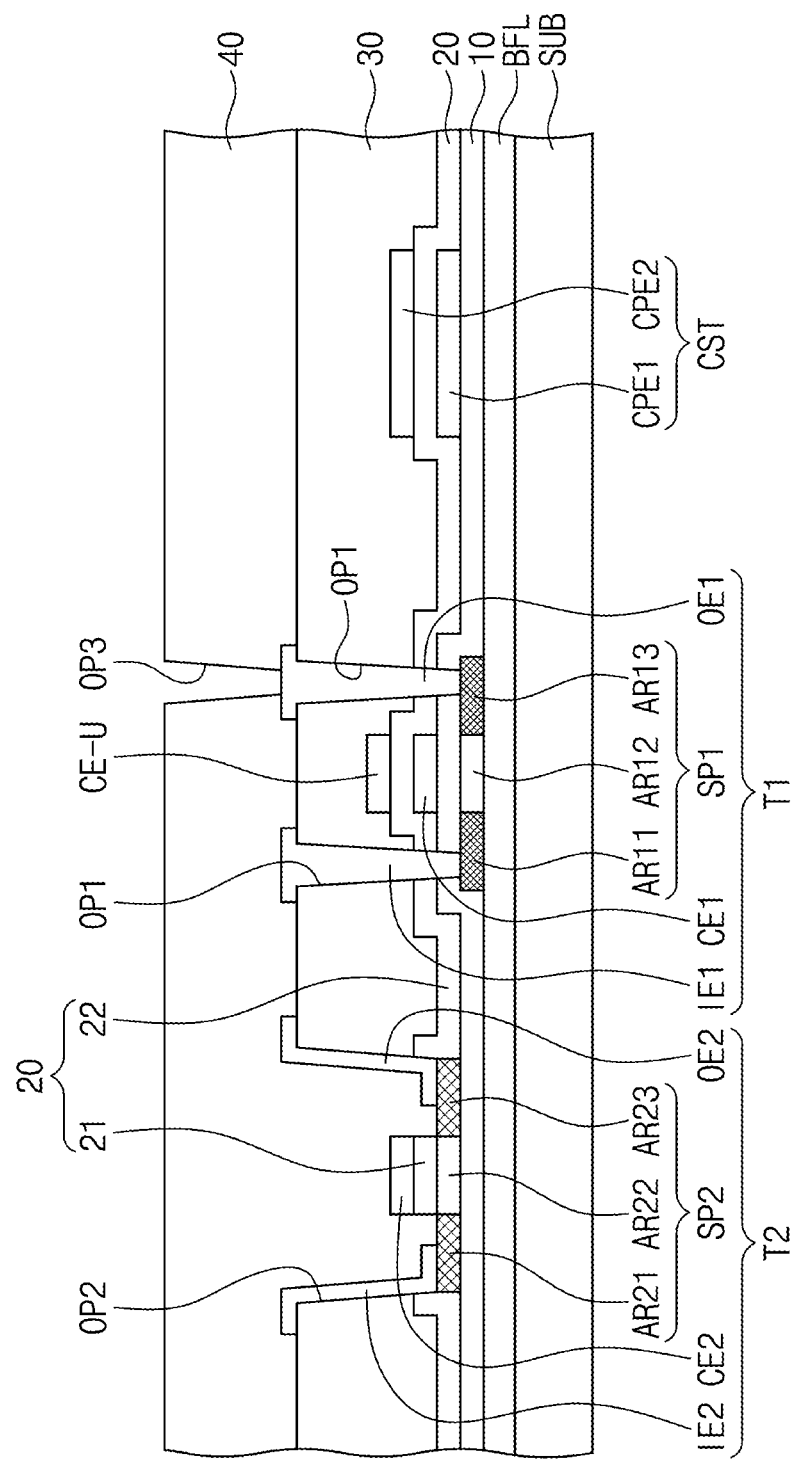

Then, as shown in FIG. 4K, a fourth insulating layer 40 is formed by forming a third through part OP3 in the initial fourth insulating layer 40-A. The third through part OP3 is formed to overlap the first output electrode OE1. The third through part OP3 exposes the first output electrode OE1.

Figure 4L:
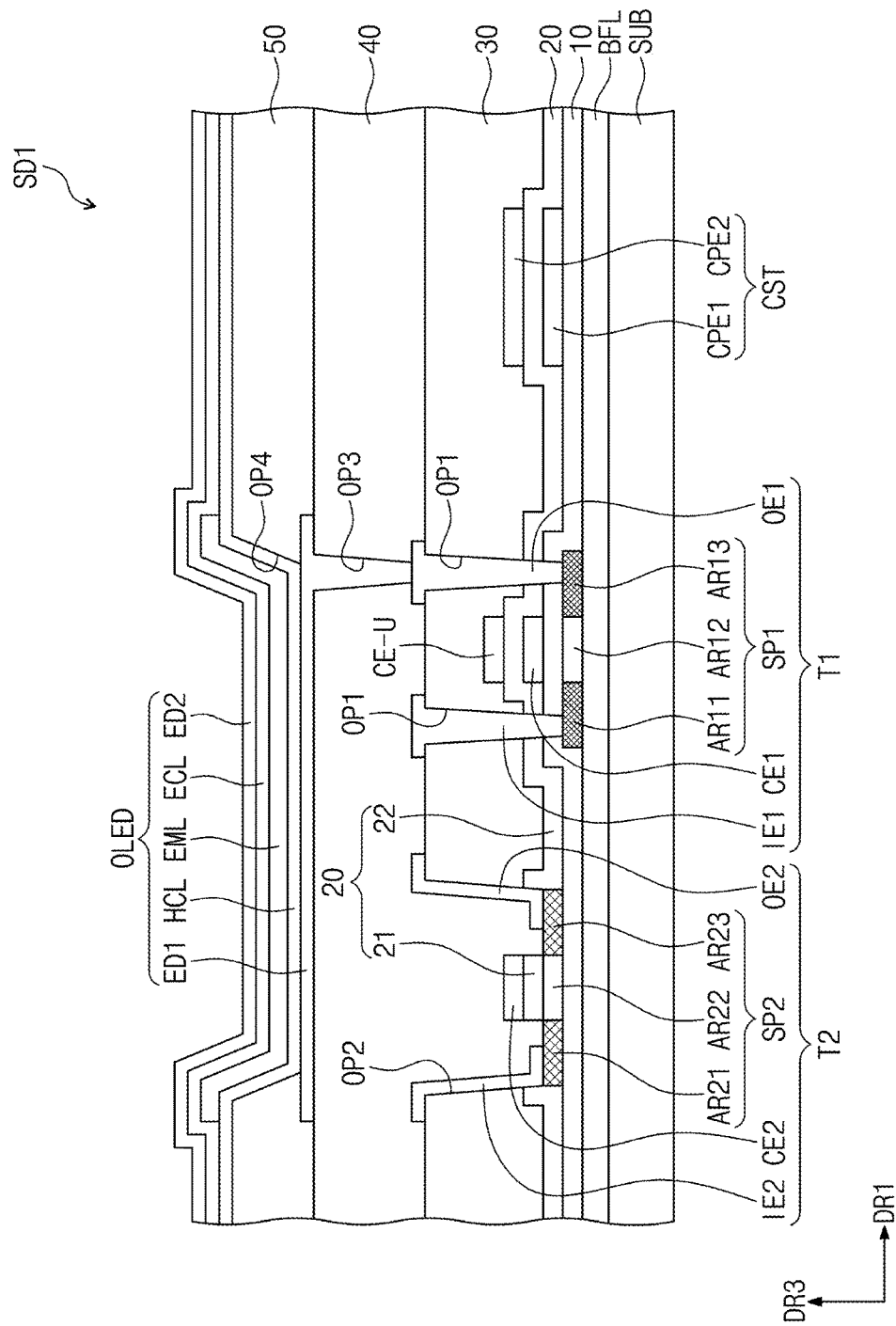

Then, as shown in FIG. 4L, an organic light emitting element OLED is formed on the fourth insulating layer 40. The organic light emitting element OLED may be formed by forming a first electrode ED1, a first charge control layer HCL, a light emitting layer EML, a second charge control layer ECL, and a second electrode ED2 on the fourth insulating layer 40.

After a layer including a conductive material is formed on the fourth insulating layer 40, the conductive material is patterned using a conventional photolithography technique to form the first electrode ED1. A portion of the first electrode ED1 may fill the third through part OP3. The first electrode ED1 may connect to the first output electrode OE1 through the third through part OP3.

Then, a fifth insulating layer 50 may be formed on the fourth insulating layer 40. After a layer including an organic layer and/or an inorganic layer is formed on the fourth insulating layer 40, the fifth insulating layer 50 may be formed by defining a predetermined opening part OP4. The opening part OP4 may be defined to exposes at least a portion of the first electrode ED1.

The first charge control layer HCL is formed on the first electrode ED1. The first charge control layer HCL may be formed to cover the first electrode ED1 and the fifth insulating layer 50. The first charge control layer HCL may be formed by depositing or coating a hole transport/transfer material. However, this is described exemplarily, and the first charge control layer HCL may be formed by depositing or coating an electron transport/transfer material.

The light emitting layer EML is formed on the first charge control layer HCL. The light emitting layer EML may be formed at the opening part OP4. After a layer including a light emitting material is formed, the light emitting layer EML may be formed by patterning the layer or by coating a light emitting material on the opening part OP4.

The second charge control layer ECL is formed on the light emitting layer EML. The second charge control layer ECL may be formed to overlap the first charge control layer HCL. The second charge control layer ECL may be formed by depositing or coating a charge transport/transfer material. However, this is described exemplarily, and the second charge control layer ECL may be formed by depositing or coating a hole transport/transfer material.

The second electrode ED2 is formed on the second charge control layer ECL. The second electrode ED2 may be formed by depositing, coating, or printing a conductive material on the second charge control layer ECL. The second electrode ED2 may be formed to overlap the second charge control layer ECL. Moreover, this is described exemplarily and the second electrode ED2 may be patterned to have the same form as the first electrode ED1 on a plane.

Figure 5A:
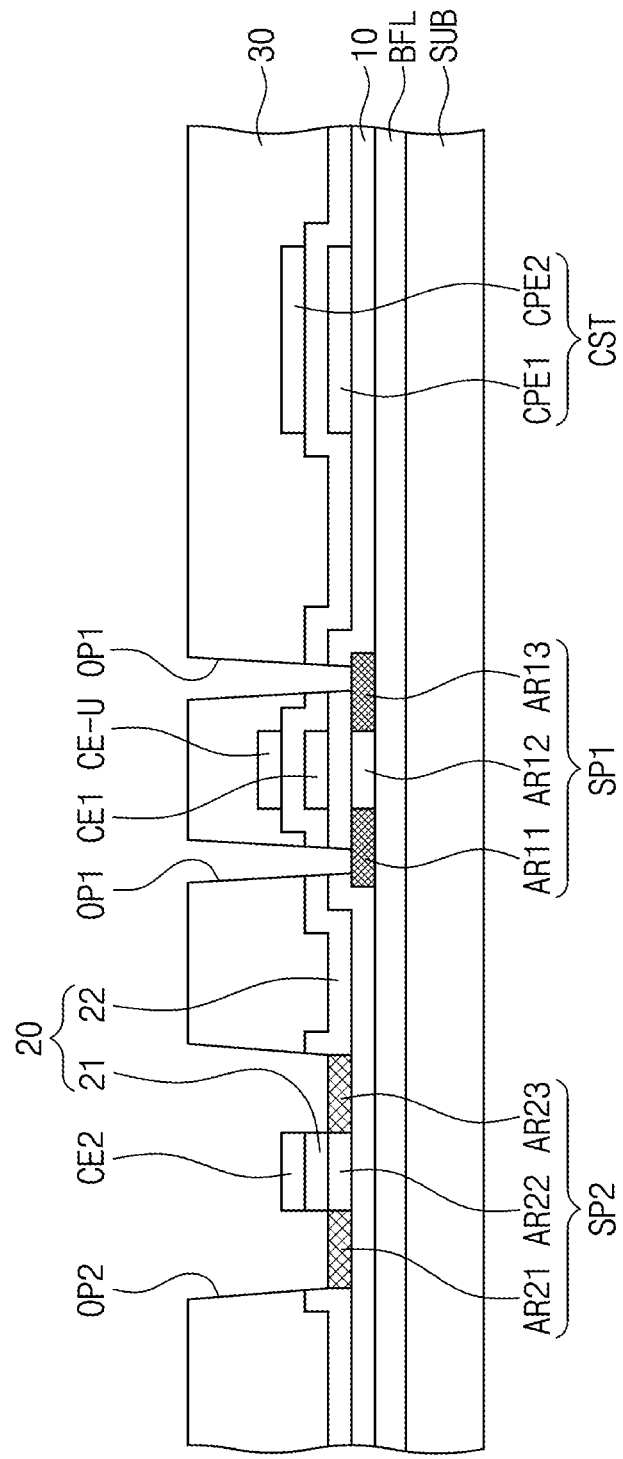
Figure 5C:
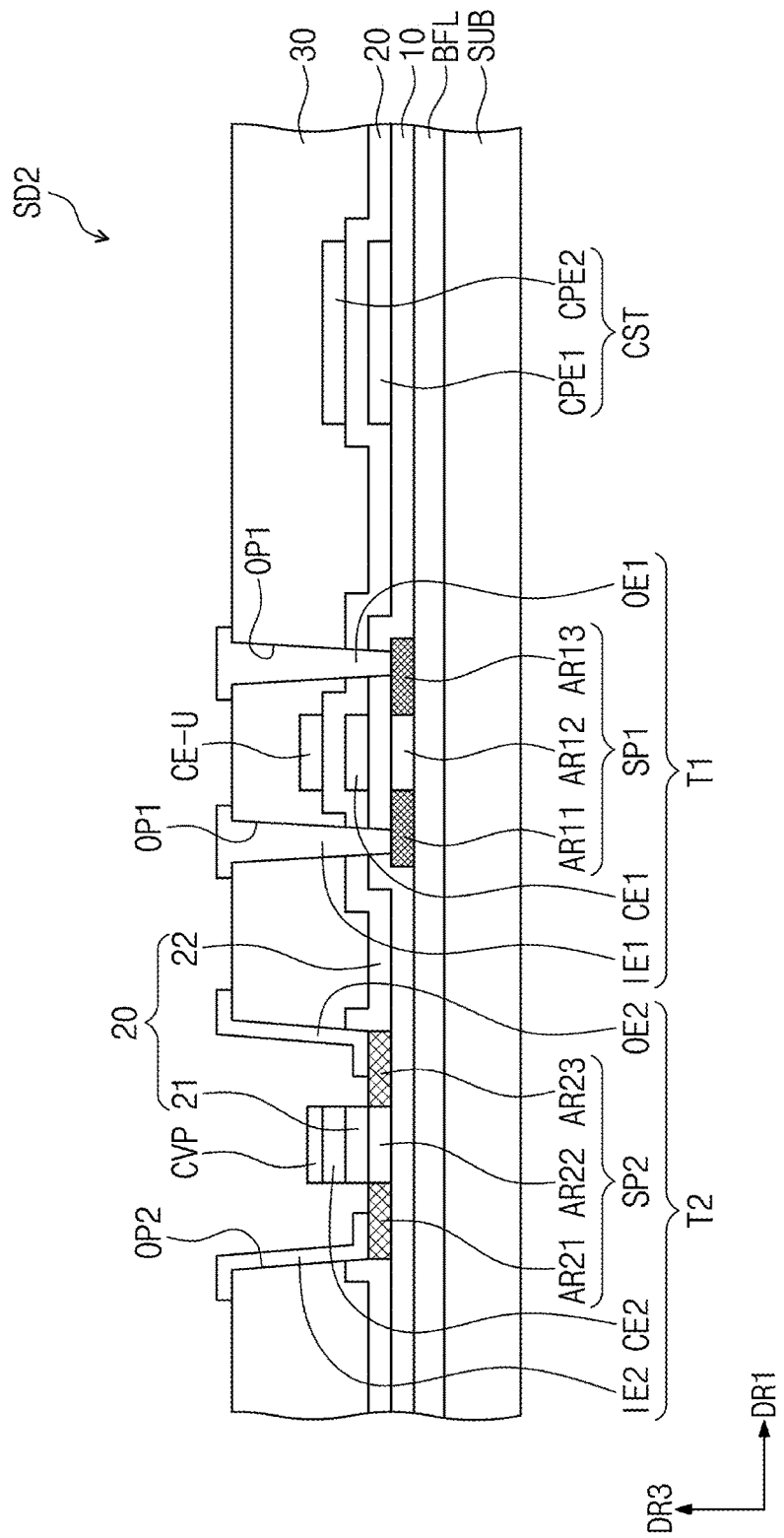

FIGS. 5A to 5C are cross-sectional views illustrating a method of manufacturing a semiconductor device according to an embodiment of the inventive concept.

FIGS. 5A to 5C exemplarily show an embodiment for a method of manufacturing the semiconductor device SD2 shown in FIG. 3. Moreover, like reference numerals refer to like elements throughout FIGS. 1 to 5C and overlapping descriptions are omitted.

As shown in FIG. 5A, a first semiconductor pattern SP1, a second semiconductor pattern SP2, a first electrode CE1, a second electrode CE2, and an upper electrode CE-U are formed on a substrate SUB and a plurality of first through parts OP1 and second through parts OP2 are formed in at least a portion of a plurality of insulating layers 10, 20, and 30. Since FIG. 5A substantially corresponds to FIG. 4H, overlapping descriptions will be omitted.

Then, as shown in FIG. 5B, a conductive layer CL2 is formed on the third insulating layer 30. The conductive layer CL2 may be formed by coating or depositing a conductive material on the entire surface of the third insulating layer 30. At this point, the conductive layer CL2 may be formed in the first through parts OP1 and the second through part OP2. Accordingly, the conductive layer CL2 contacts a portion of a first area AR11 of the first semiconductor pattern SP1 and a portion of a third area AR13 of the first semiconductor pattern SP1, each exposed by the first through parts OP1, and a first area AR21, a third area AR23, and a second control electrode CE2 of the second semiconductor pattern SP2, each exposed by the second through part OP2.

Then, as shown in FIGS. 5B and 5C, a first input electrode IE1, a first output electrode OE1, a second input electrode IE2, a second output electrode OE2, and a cover pattern CVP are formed by patterning the conductive layer CL2. The conductive layer CL2 may be exposed to an etching gas ET to form the first input electrode IE1, the first output electrode OE1, the second input electrode IE2, the second output electrode OE2, and the cover pattern CVP after forming a mask pattern using a predetermined mask. The etching gas ET may include a material having a higher etching rate with respect to the conductive layer CL2 and having a lower etching rate with respect to the third insulating layer 30.

At this point, the cover pattern CVP may be formed during a process for patterning the conductive layer CL2. That is, the cover pattern CVP may be formed simultaneously together with the first input electrode IE1, the first output electrode OE1, the second input electrode IE2, and the second output electrode OE2. Accordingly, the cover pattern CVP may include the same material as the first input electrode IE1, the first output electrode OE1, the second input electrode IE2, and the second output electrode OE2.

A mask used during the patterning process of the conductive layer CL2 may have a form that covers an area overlapping the second control electrode CE2 to allow an area overlapping the second control electrode CE2 not to be exposed to the etching gas ET. However, an area overlapping the second control electrode CE2 may be exposed to a portion of the etching gas ET due to errors in a process or may be exposed to the etching gas ET due to over-etch.

At this point, an area overlapping the second control electrode CE2 in the conductive layer CL2 may be partially etched by the etching gas ET. Accordingly, although not shown in the drawing, at least a portion of the surface of the cover pattern CVP may be damaged by the etching gas ET.

The cover pattern CVP according to an embodiment of the inventive concept covers the second control electrode CE2 so that the second control electrode CE2 may be prevented from being exposed to the etching gas ET. Accordingly, even if the second control electrode CE includes a material etched by the etching gas ET, the cover pattern CVP may protect the second electrode CE2 from being damaged due to the etching gas ET. According to an embodiment of the inventive concept, since the damage of the second control electrode CE2 is prevented during the patterning process of the conductive layer CL2, without restriction to a component material of the second control electrode CE2, various kinds of etching gases ET may be selected and process reliability may be improved.

FIGS. 6A to 6F are cross-sectional views illustrating a method of manufacturing a semiconductor device according to an embodiment of the inventive concept. FIGS. 6A to 6F exemplarily show an embodiment for a method of manufacturing the semiconductor device SD2 shown in FIG. 3. Moreover, like reference numerals refer to like elements throughout FIGS. 1 to 6F and overlapping descriptions are omitted.

As shown in FIG. 6A, after a first semiconductor pattern SP1 is formed on a substrate SUB, an initial second semiconductor pattern SP2-A, a first control electrode CE1, a capacitor CST, an upper electrode CE-U, and a second control electrode CE2 are formed. FIG. 6A may correspond to an operation before the initial third insulating layer 30-A of FIG. 4F is formed. Accordingly, detailed description refers to FIGS. 4A to 4F.

Then, as shown in FIG. 6B, a cover pattern CVP-1 is formed on the second control electrode CE2. After a layer including an insulation material is formed on the second control electrode CE2, the insulation material is patterned using a conventional photolithography technique to form the cover pattern CVP-1. Alternatively, after a mask for exposing the second control electrode CE2 and covering the remaining areas is formed, the cover pattern CVP-1 may be formed by forming an insulating layer on the mask and removing the mask.

The cover pattern CVP-1 overlaps at least the second control electrode CE2. In this embodiment, the cover pattern CVP-1 and the second control electrode CE2 may have the same configuration in a plan view. Moreover, this is described exemplarily, and the cover pattern CVP-1 and the second control electrode CE2 may be formed at the same time in an operation for forming the second control electrode CE2. At this point, the cover pattern CVP-1 and the second control electrode CE2 may be patterned at the same time by using one mask. Although not shown in the drawing, in an embodiment of this invention, the cover pattern CVP-1 may be formed on the upper electrode CE-U and the second capacitor electrode CPE2 when forming the cover pattern CVP-1 on the second control electrode CE2. By forming the cover pattern CVP-1 on the second control electrode CE2, the upper electrode CE-U and the second capacitor electrode CPE2, mask process to form the cover pattern CVP-1, the second control electrode CE2, the upper electrode CE-U and the second capacitor electrode CPE2 may be reduced. The cover pattern CVP-1 according to an embodiment of the inventive concept may be formed through various processes and is not limited to any one embodiment.

Figure 6C:
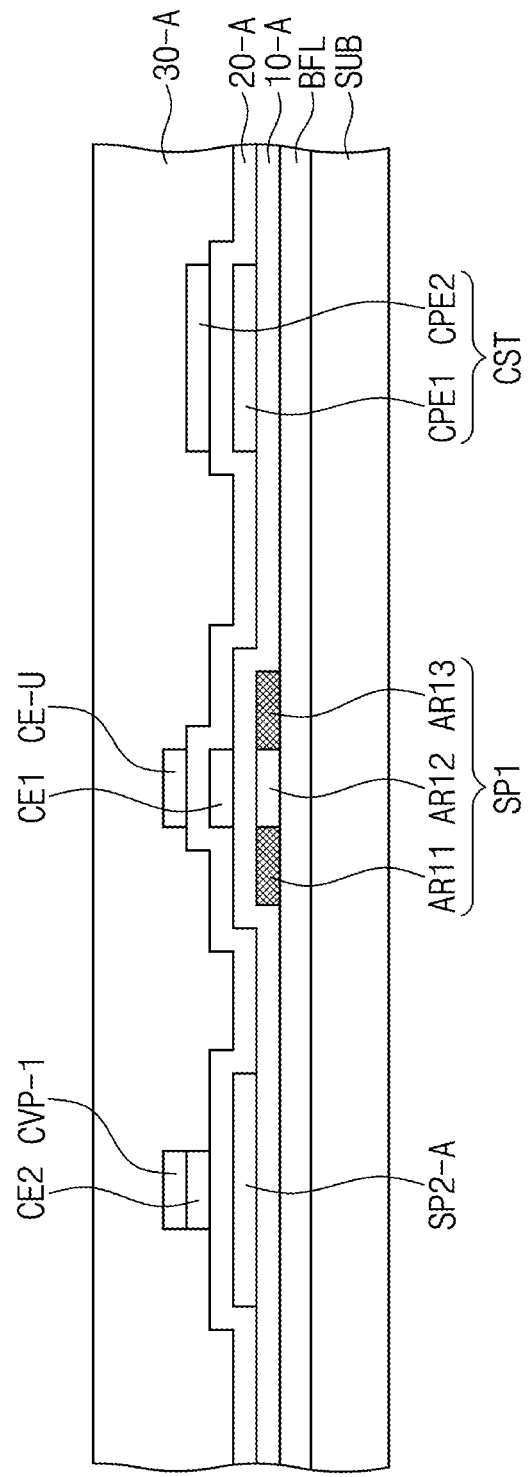

Then, as shown in FIG. 6C, an initial third insulating layer 30-A is formed. The initial third insulating layer 30-A may be formed by depositing, coating, or printing an organic material and/or an inorganic material on the initial second insulating layer 20-A. The initial third insulating layer 30-A is formed on the initial second insulating layer 20-A to cover the cover pattern CVP-1, the second control electrode CE2, the upper electrode CE-U, and the second capacitor electrode CPE2.

Figure 6D:
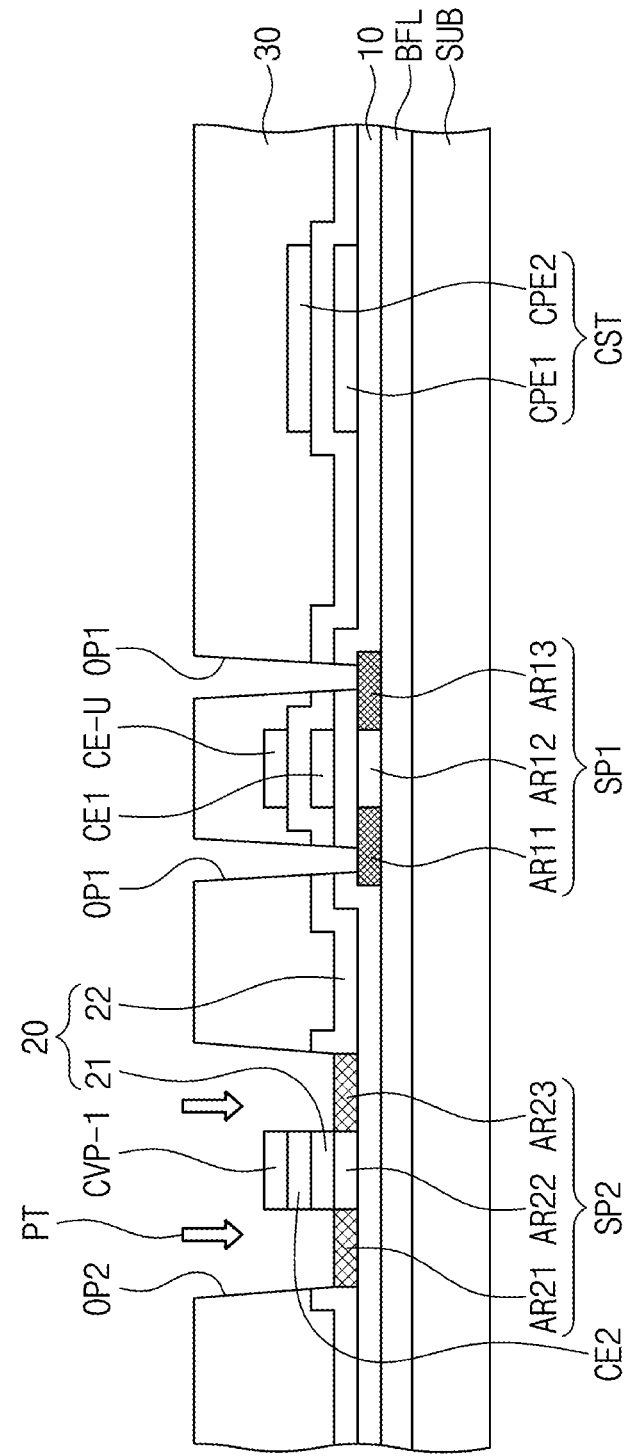

Then, as shown in FIG. 6D, a first insulating layer 10, a second insulating layer 20, and a third insulating layer 30 are formed and a second semiconductor pattern SP2 is formed. As mentioned above, the first insulating layer 10, the second insulating layer 20, and the third insulating layer 30 may be formed by forming the first through parts OP1 and the second through part OP2. Detailed description for this refers to FIG. 4G and overlapping description will be omitted.

A second semiconductor pattern SP2 may be formed by performing plasma treatment PT on an initial second semiconductor pattern SP2-A. The plasma treatment PT may be performed by exposing the initial second semiconductor pattern SP2-A to a reducing plasma gas after the second through part OP2 is formed. Moreover, this is described exemplarily, and the plasma treatment PT according to an embodiment of the inventive concept may be performed continuously with a process for forming the second through part OP2. At this point, the plasma treatment PT may correspond to an etching gas for forming the second through part OP2.

A process for forming the second semiconductor pattern SP2 may correspond to FIG. 4H and thus, its overlapping description will be omitted. The second semiconductor pattern SP2 according to an embodiment of the inventive concept may be formed through various methods and is not limited to any one embodiment.

Figure 6E:
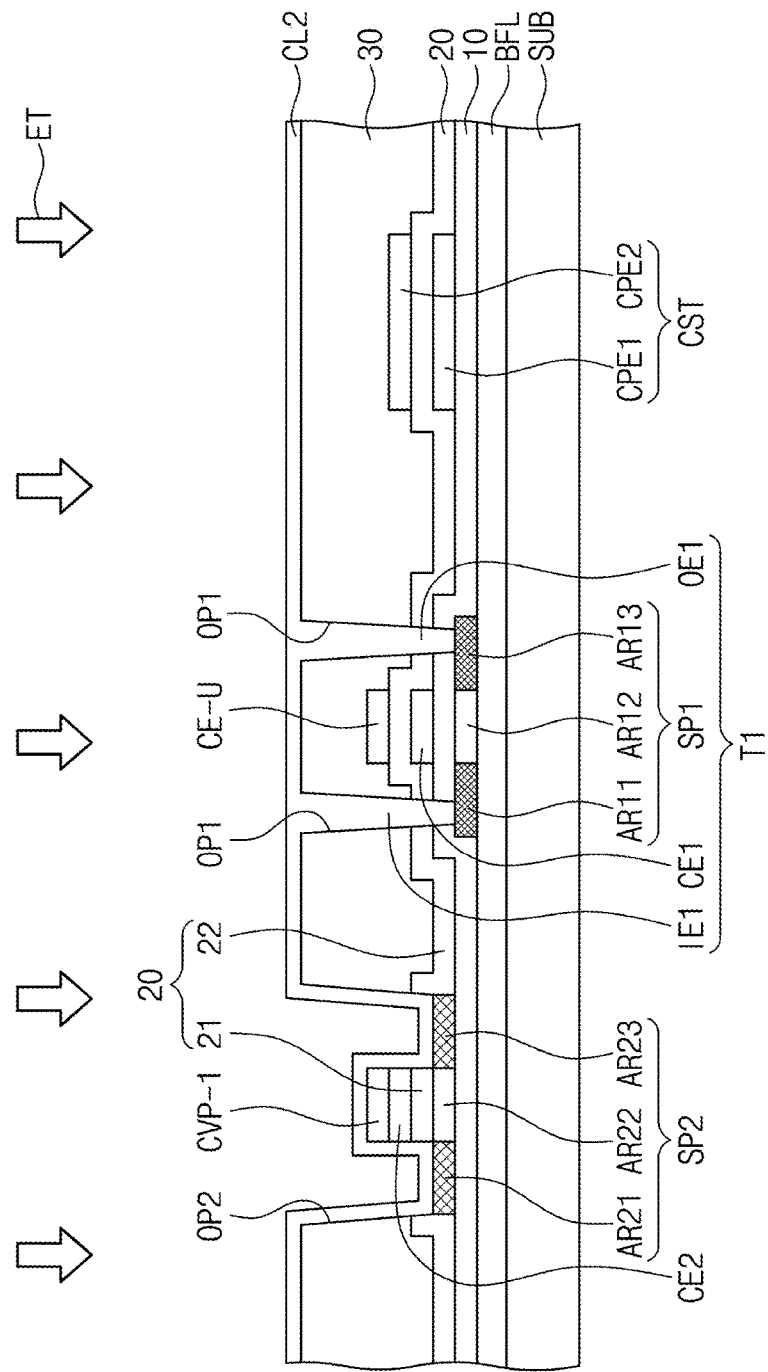

Then, as shown in FIGS. 6E and 6F, after a conductive layer CL2 is formed on the third insulating layer 30, the conductive layer is patterned using a conventional photolithography to form a first input electrode IE1, a first output electrode OE1, a second input electrode IE2, and a second output electrode OE2. The conductive layer CL2 may be formed by depositing, coating, or printing a conductive material on the third insulating layer 30. The conductive layer CL2 overlaps the first through parts OP1 and the second through part OP2. The conductive layer CL2 covers the second semiconductor pattern SP2 and the cover pattern CVP-1 in the second through part OP2.

Then, the conductive layer CL2 may be patterned through an etching process. As a predetermined etching gas ET is provided, the first input electrode IE1, the first output electrode OE1, the second input electrode IE2, and the second output electrode OE2 may be patterned (not shown).

At this point, the cover pattern CVP-1 may be disposed on the second control electrode CE2 to protect it from the etching gas ET. Accordingly, even if the second control electrode CE2 and the conductive layer CL2 are formed of the same material, the second control electrode CE2 may not be damaged by the etching gas ET.

The cover pattern CVP-1 may protect the second control electrode CE2 stably during the formation processes of the first input electrode IE1, the first output electrode OE1, the second input electrode IE2, and the second output electrode OE2. Accordingly, the second control electrode CE2 may be formed of various materials and reliability may be improved during a process of the second control electrode CE2.

According to the inventive concept, during a patterning process of one insulating layer, by preventing the damage of another insulating layer around, stability may be secured during the processing of an insulating layer that constitutes a semiconductor device. Additionally, the patterning of an insulating layer and the forming of an electrode contact part may be performed at the same time through one process, so that manufacturing processes for a semiconductor device may be simplified and process costs may be reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A semiconductor device comprising:
    a base substrate;
    a first transistor disposed on the base substrate and comprising a first semiconductor pattern, a first control electrode, a first input electrode, and a first output electrode;
    a second transistor disposed on the base substrate and comprising a second semiconductor pattern, a second control electrode, a second input electrode, and a second output electrode;
    a plurality of insulating layers; and
    a through part penetrating at least one of the plurality of insulating layers,
    wherein each of the first input electrode and the first output electrode is connected to the first semiconductor pattern through a common first through part.

2. The semiconductor device of claim 1, wherein the first semiconductor pattern comprises a first area overlapping the first control electrode, and a second area and a third area spaced apart from each other with the first area disposed therebetween; and the first through part exposes the second area and the third area.

3. The semiconductor device of claim 2, wherein the first through part penetrates a first insulating layer and a second insulating layer,
    wherein the first insulating layer is disposed between the first control electrode and the first semiconductor pattern and the second insulating layer is disposed on the first insulating layer; and
    wherein the first input electrode and the first output electrode are disposed on the second insulating layer to contact the first semiconductor pattern through the first through part.

4. The semiconductor device of claim 3, wherein the first insulating layer comprises:
    a first insulating pattern which overlaps the first area and the first control electrode; and
    a second insulating pattern which exposes the second area and the third area with the first insulating pattern therebetween in a plan view.

5. The semiconductor device of claim 4, wherein at least a portion of the first insulating pattern is connected to the second insulating pattern.

6. The semiconductor device of claim 4, wherein the first through part exposes a side surface of the first insulating pattern and a side surface of the first control electrode.

7. The semiconductor device of claim 6, wherein the side surface of the first insulating pattern is aligned with the side surface of the first control electrode in a cross-sectional view.

8. The semiconductor device of claim 4, wherein an area where the first through part is defined in the first insulating layer and an area where the first through part is defined in the second insulating layer have different configuration in a plan view.

9. The semiconductor device of claim 8, wherein the area where the first through part is defined in the second insulating layer overlaps at least the first semiconductor pattern in a plan view.

10. The semiconductor device of claim 3, further comprising second through parts penetrating at least a portion of the insulating layers;
    the second input electrode connected to the second semiconductor pattern through one of the second through parts; and
    the second output electrode connected to the second semiconductor pattern through another of the second through parts.

11. The semiconductor device of claim 10, wherein each of the through part penetrates the first insulating layer, the second insulating layer, and a third insulating layer disposed between the second control electrode and the second semiconductor pattern among the insulating layers; and
    the first semiconductor pattern is disposed on the third insulating layer and the second semiconductor pattern is covered by the third insulating layer.

12. The semiconductor device of claim 11, further comprising:
    a first capacitor electrode disposed on the third insulating layer; and
    a second capacitor electrode disposed on the first capacitor electrode and forming an electric field with the first capacitor electrode,
    wherein the second capacitor electrodes are spaced apart from each other with the first insulating layer disposed therebetween.

13. The semiconductor device of claim 12, further comprising an upper electrode disposed on the second control electrode and overlapping the second control electrode,
    wherein the upper electrode is spaced apart from the second control electrode with the first insulating layer disposed therebetween and the upper electrode is connected to the second capacitor electrode.

14. The semiconductor device of claim 1, wherein the first through part exposes an upper surface of the first control electrode.

15. The semiconductor device of claim 1, further comprising a cover pattern covering the first control electrode,
    wherein the first through part exposes an upper surface of the cover pattern.

16. The semiconductor device of claim 15, wherein the cover pattern has the same configuration as the first control electrode in a plan view.

17. The semiconductor device of claim 1, wherein the first semiconductor pattern comprises an oxide semiconductor.

18. The semiconductor device of claim 17, wherein the second semiconductor pattern comprises a crystalline semiconductor.

19. The semiconductor device of claim 17, further comprising an organic light emitting device directly connected to the second transistor.

20. The semiconductor device of claim 17, wherein the first through part and the second through part are formed at the same time.

21. A method of manufacturing a semiconductor device, the method comprising:
    forming an initial first semiconductor pattern on a base substrate;
    forming a first insulating layer on the initial first semiconductor pattern;
    forming a first control electrode on the first insulating layer;
    forming a second insulating layer on the first insulating layer to cover the first control electrode;
    forming a first through part in the second insulating layer and the first insulating layer to expose at least portion of the initial first semiconductor pattern and a side surface of the first control electrode;
    forming a channel area on the initial first semiconductor pattern to form a first semiconductor pattern; and forming each of a first input electrode and a first output electrode on the second insulating layer to contact the first semiconductor pattern via a common first through part.

22. The method of claim 21, wherein the forming of the first through part uses an etching process.

23. The method of claim 22, wherein, during the forming of the first through part, the first insulating layer which is not covered by the first control electrode is etched using the first control electrode as an etching mask.

24. The method of claim 23, wherein the first insulating pattern is self-aligned with the first control electrode.

25. The method of claim 22, further comprising, before the forming of the second insulating layer, forming a cover pattern covering the first control electrode on the first control electrode, wherein the first through part exposes an upper surface of the cover pattern.

26. The method of claim 25, wherein the cover pattern has a good etching selectivity with the second insulating layer in an etchant used during the etching process.

27. The method of claim 21, wherein the forming of the first semiconductor pattern comprises performing plasma treatment on the exposed portion of the initial first semiconductor pattern through the first through part.

28. The method of claim 21, further comprising, before the forming of the initial first semiconductor pattern, forming an initial second semiconductor pattern on the base substrate; and forming a third insulating layer on the initial second semiconductor pattern, and further comprising, after the forming of the first control electrode, forming a channel area, a source area, and a drain area on the initial second semiconductor pattern to form a second semiconductor pattern, wherein the forming of the first through part further comprises forming a plurality of second through parts in the first to third insulating layers to overlap the second semiconductor pattern.

29. The method of claim 21, wherein the first through part exposes an upper surface of the first control electrode.

30. The method of claim 29, wherein the forming of each of the first input electrode and the first output electrode comprises:

forming a conductive layer on the second insulating layer to cover the exposed first control electrode; and patterning the conductive layer to simultaneously form the first input electrode, the first output electrode, and a cover pattern spaced apart from the first input electrode and the second output electrode in a plan view to cover the first control electrode, wherein the cover pattern has the same configuration as the first control electrode in a plan view.

* * * * *